(12) United States Patent
Le et al.

(10) Patent No.: US 6,798,275 B1
(45) Date of Patent: Sep. 28, 2004

(54) FAST, ACCURATE AND LOW POWER SUPPLY VOLTAGE BOOSTER USING A/D CONVERTER

(75) Inventors: Binh Quang Le, San Jose, CA (US); Cathy Thuvan Ly, Santa Clara, CA (US); Lee Cleveland, Santa Clara, CA (US); Pau-Ling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/406,415

(22) Filed: Apr. 3, 2003

(51) Int. Cl.[7] ............................. G05F 1/10; G05F 3/02
(52) U.S. Cl. ........................................ 327/536; 365/226
(58) Field of Search .................... 327/536, 589; 363/59, 60; 365/336

(56) References Cited

U.S. PATENT DOCUMENTS

| | | | |
|---|---|---|---|
| 5,510,749 A | 4/1996 | Arimoto | 327/536 |
| 5,726,944 A | 3/1998 | Pelley, III et al. | 365/226 |
| 5,729,172 A | 3/1998 | Tsukada | 327/536 |
| 5,973,546 A | 10/1999 | Le et al. | 327/536 |
| 6,212,107 B1 | 4/2001 | Tsukada | 365/189.09 |
| 6,236,581 B1 | 5/2001 | Foss et al. | 363/60 |
| 6,259,635 B1 | 7/2001 | Khouri et al. | 365/185.18 |
| 6,424,570 B1 * | 7/2002 | Le et al. | 365/185.18 |

FOREIGN PATENT DOCUMENTS

EP    0 766 256 A1    4/1997

OTHER PUBLICATIONS

US 5,612,921, 3/1997, Chang et al. (withdrawn)
U.S. patent No. 5,612,921, Date of patent Mar. 18, 1997, Inventors Chung K. Chang, Johnny C. Chen and Lee E. Cleveland, printed from the Westlaw patent database. 10 pgs.

* cited by examiner

Primary Examiner—Terry D. Cunningham
Assistant Examiner—Quan Tra
(74) Attorney, Agent, or Firm—Eschweiler & Associates, LLC

(57) ABSTRACT

Flash memory array systems and methods are disclosed for producing a regulated boosted word line voltage for read operations. The system comprises a multi-stage voltage boost circuit operable to receive a supply voltage and one or more output signals from a supply voltage detection circuit to generate the boosted word line voltage having a value greater than the supply voltage. The voltage boost circuit comprises a precharge circuit and a plurality of boost cells connected to a common node of the boosted word line, and a timing control circuit. The stages of the plurality of boost cells are coupled in series for charge sharing between the stages, and couple a predetermined number of boost cells to the boosted word line common node to provide an intermediate voltage to the boosted word line during the pre-boost timing, thereby anticipating a final boosted word line voltage provided during the boost timing. The voltage boost circuit is operable to receive the one or more output signals from the supply voltage detection circuit and alter a boost gain of the multi-stage voltage boost circuit based on the one or more output signals, thereby causing the boosted word line voltage to be substantially independent of the supply voltage value.

19 Claims, 13 Drawing Sheets

FAST, ACCURATE AND LOW POWER SUPPLY VOLTAGE BOOSTER USING A/D CONVERTER

FIELD OF INVENTION

The present invention relates generally to memory systems and in particular, to flash memory array systems and methods for producing a voltage boost circuit, wherein a voltage detection circuit may be used to measure the $V_{CC}$ applied to a voltage boost circuit, along with boost compensation circuitry to regulate the boost voltage output from $V_{CC}$ variations. The boost voltage may be applied to a wordline for read mode operations of memory cells.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells are typically comprised of a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell MOS device. In an erase or program operation the voltages are applied so as to cause a charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a type of electronic memory media which can be rewritten and hold its content without power. Flash memory devices generally have life spans from 100K to 1MEG write cycles. Unlike dynamic random access memory (DRAM) and static random access memory (SRAM) memory chips, in which a single byte can be erased, flash memory is typically erased in fixed multi-bit blocks or sectors. Conventional flash memories are constructed in a cell structure wherein a single bit of information is stored in each flash memory cell. In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell associated with a given bit line has its stacked gate terminal coupled to a different word line, while all the flash cells in the array have their source terminals coupled to a common source terminal. In operation, individual flash cells are addressed via the respective bit line and word line using peripheral decoder and control circuitry for programming (writing); reading or erasing functions.

Such a single bit stacked gate flash memory cell is programmed by applying a relatively high voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bit line, which may be connected to the drains of other cells in a byte or word group. The voltage at the drain in conventional stacked gate memory cells is typically provided at between 0.5 and 1.0 volts in a read operation. A voltage is then applied to the gate (e.g., the word line) of the memory cell transistor in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

More recently, dual bit flash memory cells have been introduced, which allow the storage of two bits of information in a single memory cell. The bit line voltage required to read dual bit memory cells is typically higher than that of single bit, stacked gate architecture memory cells, due to the physical construction of the dual bit cell. For example, some dual bit memory cell architectures require between 1.5 and 2.0 volts to properly bias the bit line or drain of such cells in a read operation. Because the voltage applied to the bit line or drain of the memory cell is derived from the memory device supply voltage ($V_{CC}$), the ability to provide the higher bit line voltage required to read the newer dual bit memory cells may be impaired when the supply voltage is at or near lower rated levels. In addition, low power applications for memory devices, such as cellular telephones, laptop computers, and the like, may further reduce the supply voltage available.

In a prior art flash memory device, boosted voltage circuits apply a boosted word line voltage for the read mode operations of memory cells. $V_{CC}$ variations are typically reflected in the output of the boost voltage circuit that is supplied to the word line of the flash memory array, during a read operation. Such variations in word line voltages from the boost circuit degrades the ability in the read mode circuitry to discriminate accurately whether or not a cell is programmed. In addition, as device densities and memory speed requirements continue to increase, the speed requirement of the voltage booster circuit may need to increase to keep pace with the remainder of the memory circuit. Further, as supply voltage levels decrease with the higher density architectures, a single stage voltage booster circuit may be inadequate to supply the required boost voltage. Accordingly, there is a need for a means of compensation for the variations in the $V_{CC}$ supply applied to a multi-stage boosted voltage circuit, and for fast boost voltage regulation.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its sole purpose is to present some concepts of the invention in a simplified form as a prelude to the more detailed description that is presented later.

In the present invention of flash memory array systems and methods for producing a multi-stage voltage boost circuit, one or more output signals from a voltage detection circuit used to measure the value of $V_{CC}$ is applied to a voltage boost circuit that is used to generate a boosted word line voltage for the read mode operations of memory cells. $V_{CC}$ variations are typically reflected in the output of the boost voltage circuit that is supplied to the word line of the flash memory array. By compensating for the variations in the $V_{CC}$ supply applied to the voltage boost circuit, the boost voltage is regulated, thereby enabling a more consistent read voltage on the word line.

According to one aspect of the present invention, a voltage value associated with the $V_{CC}$ supply voltage is ascertained, for example, using an A/D converter. The determined voltage value is then used to compensate or otherwise adjust a single or a multi-stage voltage boost circuit. For example, a digital word representing the $V_{CC}$ voltage value is used to vary effective boost capacitance and load capacitance values within the voltage boost circuit, thereby resulting in an output boost voltage that is substantially independent of variations in $V_{CC}$. Consequently, the present invention provides a generally constant boost voltage, for example, a boosted word line voltage, which facilitates an accurate reading of flash memory cells despite fluctuations in the $V_{CC}$.

In another aspect of the present invention, the final regulated output voltage of the voltage boost circuit (voltage booster) is anticipated by selecting a set of predetermined boost cells to provide a boosted voltage level during a pre-boost timing preceding the boost timing. The pre-boost timing occurs before the A/D converter has completed determining and latching an output of the digital word representing the $V_{CC}$ voltage that is then followed by the actual boost operation during the boost timing.

In still another aspect of the present invention, the voltage booster circuit comprises a plurality of boost cells having one or more boost stage capacitors in each boost cell, a precharge circuit, and a timing control circuit comprising a precharge gate booster and a boost timer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
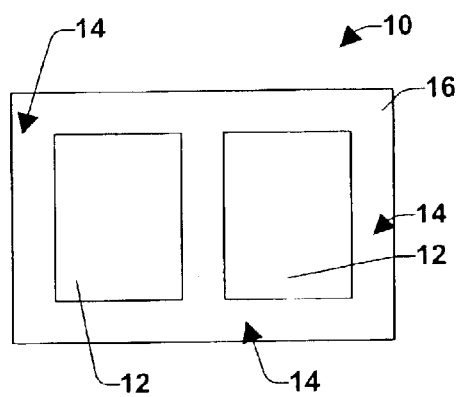
FIG. 1 is a plan view schematically illustrating an exemplary layout of a memory device.

The present invention will now be described with reference to the drawings, wherein like reference numerals are used to refer to like elements throughout. The present invention relates to a flash memory array circuit for producing a boosted voltage which is substantially independent of $V_{CC}$ fluctuations, and which may be used as a boosted word line voltage for the read mode operations of memory cells. The invention comprises a multi-stage voltage boost circuit that provides a boosted voltage which is greater than the supply voltage, and finds particular usefulness in low supply voltage applications. The $V_{CC}$ power supply is applied to the voltage boost circuit to supply power for the boost operation. $V_{CC}$ variations that were conventionally reflected in the output of the boost voltage circuit are identified and compensation for such variations are generated to thereby generate word line voltages during a read mode which are substantially independent of variations in $V_{CC}$.

According to an exemplary aspect of the present invention, the system receives one or more output signals from a voltage detection circuit (e.g. analog to digital converter, digital thermometer) used to measure the $V_{CC}$ that is applied to a voltage boost circuit. The voltage boost circuit comprises a plurality of boost cells having one or more boost stages per boost cell. The voltage boost circuit may, for example, be used to generate a boosted word line voltage for the read mode operations of memory cells. The detected $V_{CC}$ value is then employed in the boost cells providing compensation to vary a manner in which the boost circuit output voltage is generated. By compensating for these variations in the $V_{CC}$ supply that is applied to the voltage boost circuit, the boost voltage can be regulated, enabling a more stable word line read voltage. This allows proper read operations with respect to the memory cell of interest in the flash memory, even where the supply voltage varies.

Another feature of the present invention relates to the reduction or elimination of the slow response time typical of voltage regulation circuits. Feedback, or other types of regulation response delays are of major concern in memory devices where word line rise times under about 20 ns are desired. The inventors of the present invention have devised a method of compensation that has an advantage of eliminating the cycle of: waiting for the regulation circuit elements to respond to their own outputs, feeding these outputs back to their input circuit elements, waiting for another output, then attempting to correct for subsequent outputs and inputs in an iterative fashion. Additionally, the present invention, through the use of multiple stages of voltage boost, permits the use of low supply voltages, for example, memory operations at a supply voltage of about 1.6 v.

To minimize response delays in the exemplary compensation circuit and methodology of the present invention, the voltage boost circuit (voltage booster) anticipates the final regulated output voltage of the voltage boost circuit. Predetermined most significant bit (MSB) boost cells are forced to an "ON state" to begin "pre-boosting" until the digital word from the A/D converter becomes available during the actual boost timing. Thus, in this method, an "intermediate voltage" which is roughly between (e.g., midway) the highest and the lowest boost voltage that could be selected by the digital word is forced to the boost voltage output until the final selection can be made by the A/D converter. Subsequently or concurrently, the A/D converter determines the digital word representing the $V_{CC}$ voltage and latches the word to the A/D output connected to the boost circuit input. The digital word and latch enable signal LATCH_EN at the boost circuit input selects and enables the boost cells to effectively trim the boost voltage up or down to the final boost voltage. Thus, substantially less or virtually no feedback time is required in this method.

In accordance with another aspect of the present invention, all the boost cells may be temporarily forced to the ON state during the pre-boost timing if, for example, the word line has a high load capacitance or must be assured of reaching a higher boost voltage more quickly. As the load capacitance requires a finite time to charge to the required voltage, forcing the boost cells during a brief pre-boost interval further mitigates a charge delay.

In contrast to a prior art voltage boost circuit, the exemplary fast compensation methodology further minimizes response delays and circuit complexity by eliminating the need of high voltage output stage switches that may be used to isolate the boost cells from one another. Instead, the outputs of all the boost cells are tied directly together, thus the "OFF state" boost cells (via selection of the A/D) along with the word line path, will act as a load to the "ON state" boost cells.

When the $V_{CC}$ sample is taken or otherwise determined and a certain number of A/D comparison outputs are turned ON, a corresponding number of boost cells are added to the boost circuit or to the load circuit in relation to the value of the $V_{CC}$. The amount of compensation provided to the boost circuit output $V_{BOOST}$ is therefore regulated to the $V_{CC}$ in an iterative fashion based on the number of voltage detection and compensation elements desired. The resolution of the compensation desired may be adjusted to fit the specific requirements of the boosted voltage usage, for example, by increasing the A/D converter from an 8 bit to a 16 bit A/D converter.

In another aspect of the invention, the bits of the digital word, may also be weighted (e.g., evenly, binarly, exponentially), or weighted in any other suitable fashion across the range of voltage detection, along with a weighting of their respective boost cell stage capacitors used for boost compensation as may be desired.

Figure 2:
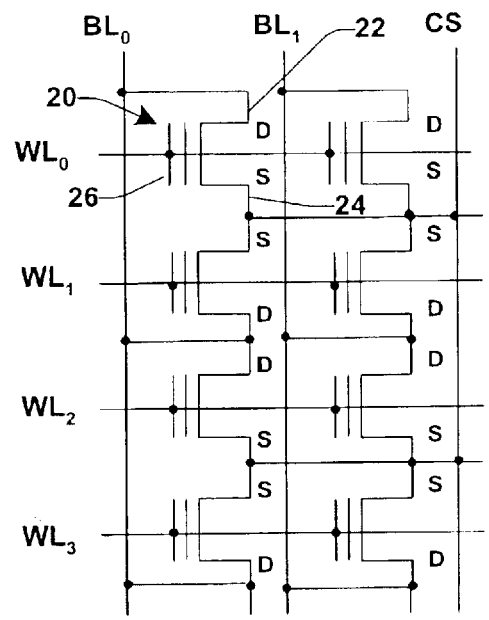
FIG. 2 is a schematic diagram illustrating an exemplary core portion of a memory circuit.

Referring initially to prior art FIGS. 1 and 2, semiconductor memory devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically include at least one M×N array of individually addressable, substantially identical memory cells and the low density peripheral portion 14 typically includes input/output (I/O) circuitry and circuitry for selectively addressing the individual cells (such as decoders for connecting the source, gate and drain of selected cells to predetermined voltages or impedances to enable designated operations of the cell such as programming, reading or erasing).

The memory cells within the core portion 12 are coupled together in a circuit configuration, such as a NOR configuration illustrated in FIG. 2. Each memory cell 20 in such an exemplary configuration has a drain 22, wherein the drains of more than one cell are connected to a common bit line, a source 24, and a stacked gate 26. Each stacked gate 26 is coupled to a word line ($WL_0$, $WL_1$, . . . , $WL_N$) while each drain 22 is coupled to a bit line ($BL_0$, $BL_1$, . . . , $BL_N$). Lastly, each source 24 is coupled to a common source line CS. Using peripheral decoder and control circuitry (not shown), each memory cell 20 may be addressed for programming, or reading functions, in a fashion known in the art.

Figure 3:
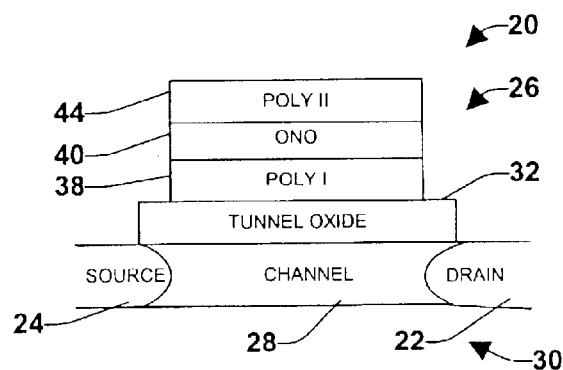
FIG. 3 is a partial cross-sectional view of a conventional stacked gate memory cell.

FIG. 3 provides a cross-sectional illustration of a typical memory cell 20 in the core region 12 of FIGS. 1 and 2. Such a memory cell 20 typically includes the source 24, the drain 22 and a channel 28 in a substrate 30; and the stacked gate structure 26 overlying the channel 28. The stacked gate 26 includes a thin gate dielectric layer 32 (commonly referred to as the tunnel oxide) formed on the surface of the substrate 30. The tunnel oxide layer 32 coats a portion of the top surface of the silicon substrate 30 and serves to support an array of different layers directly over the channel 28. The stacked gate 26 includes a first film layer 38, such as a doped polycrystalline silicon (polysilicon or poly I) layer that serves as a floating gate 38 that overlies the tunnel oxide 32. Note that the various portions of the transistor 20 highlighted above are not drawn to scale in FIG. 3, but rather are illustrated as such for ease of illustration and to facilitate an understanding of the device operation.

Above the poly I layer 38 is an interpoly dielectric layer 40. The interpoly dielectric layer 40 is often a multilayer insulator such as an oxide-nitride-oxide (ONO) layer having two oxide layers sandwiching a nitride layer, or in the an alternative can be another dielectric layer such as tantalum pentoxide. Finally, the stacked gate 26 includes an upper or second polysilicon layer (poly II) 44 which serves as a polysilicon control gate overlying the ONO layer 40. The control gates 44 of the respective cells 20 that are formed in a given row share a common word line (WL) associated with the row of cells (see, e.g., FIG. 2). In addition, as highlighted above, the drain regions 22 of the respective cells in a vertical column are connected together by a conductive bit line (BL). The channel 28 of the cell 20 conducts current between the source 24 and the drain 22 in accordance with an electric field developed in the channel 28 by the stacked gate structure 26.

The memory cell 20 is programmed by applying a relatively high gate voltage $V_G$ to the control gate 38 and a moderately high drain voltage $V_D$ to the drain 22 in order to produce "hot" (high energy) electrons in the channel 28 near the drain 22. The hot electrons accelerate across the tunnel oxide 32 and into the floating gate 34, which become trapped in the floating gate 38 because the floating gate 38 is surrounded by insulators (the interpoly dielectric 40 and the tunnel oxide 32). As a result of the trapped electrons, a threshold voltage ($V_T$) of the memory cell 20 increases. This change in the threshold voltage (and thereby the channel conductance) of the memory cell 20 created by the trapped electrons is what causes the memory cell 20 to be programmed.

To read the memory cell 20, a predetermined gate voltage greater than the threshold voltage of an unprogrammed memory cell, but less than the threshold voltage of a programmed memory cell, is applied to the control gate 44. If the memory cell 20 conducts (e.g., a sensed current in the cell exceeds a minimum value), then the memory cell 20 has not been programmed (the memory cell 20 is therefore at a first logic state, e g., a one "1"). Conversely, if the memory cell 20 does not conduct (e.g., the current through the cell does not exceed a threshold value), then the memory cell 20 has been programmed (the memory cell 20 is therefore at a second logic state, e.g., a zero "0"). Thus, each memory cell 20 may be read in order to determine whether it has been programmed (and therefore identify the logic state of the data in the memory cell 20).

In order to erase the memory cell 20, a relatively high source voltage $V_S$ is applied to the source 24 and the control gate 44 is held at a negative potential ($V_G$<0 volts), while the drain 22 is allowed to float. Under these conditions, a strong electric field is developed across the tunnel oxide 32 between the floating gate 38 and the source region 24. The electrons that arc trapped in the floating gate 38 flow toward and cluster at the portion of the floating gate 38 overlying the source region 24 and are extracted from the floating gate 38 and into the source region 22 by way of tunneling through the tunnel oxide 32. Consequently, as the electrons are removed from the floating gate 38, the memory cell 20 is erased.

It is thus seen that appropriate voltages must be applied to the various terminals (e.g., source, drain, and gate) of the cells 20 in the memory device 10 in order to perform various operations (e.g., program, erase, read) associated with the device 10. However, as stated above, the applied voltages have heretofore been derived from the supply voltage to which the device 10 is connected. Where such a supply voltage is not high enough to supply the voltages required to perform such operations, however, the device 10 may be rendered inoperative or inapplicable in certain systems. This condition may result in low power applications of the memory device 10, for instance, in portable device applications wherein the supply voltage may be low. Alternatively, the memory cells in a memory device may comprise dual bit architectures requiring higher bit line voltages at the drain of the individual cells in order to properly perform read operations. Thus, a voltage boosting circuit is needed to boost the bit line voltage in conditions where the supply voltage is insufficient to allow proper read operations. Also, as the $V_{CC}$ supply voltage changes over time, with temperature, or with the application of various loads, the boost voltage will reflect the $V_{CC}$ changes. The present invention overcomes or minimizes these problems by providing a voltage boost, and compensation for the reflected $V_{CC}$ variations in the voltage boost circuit, enabling a word line boost voltage which is substantially independent of $V_{CC}$ variations, thus providing more reliability in read operations.

Figure 4:
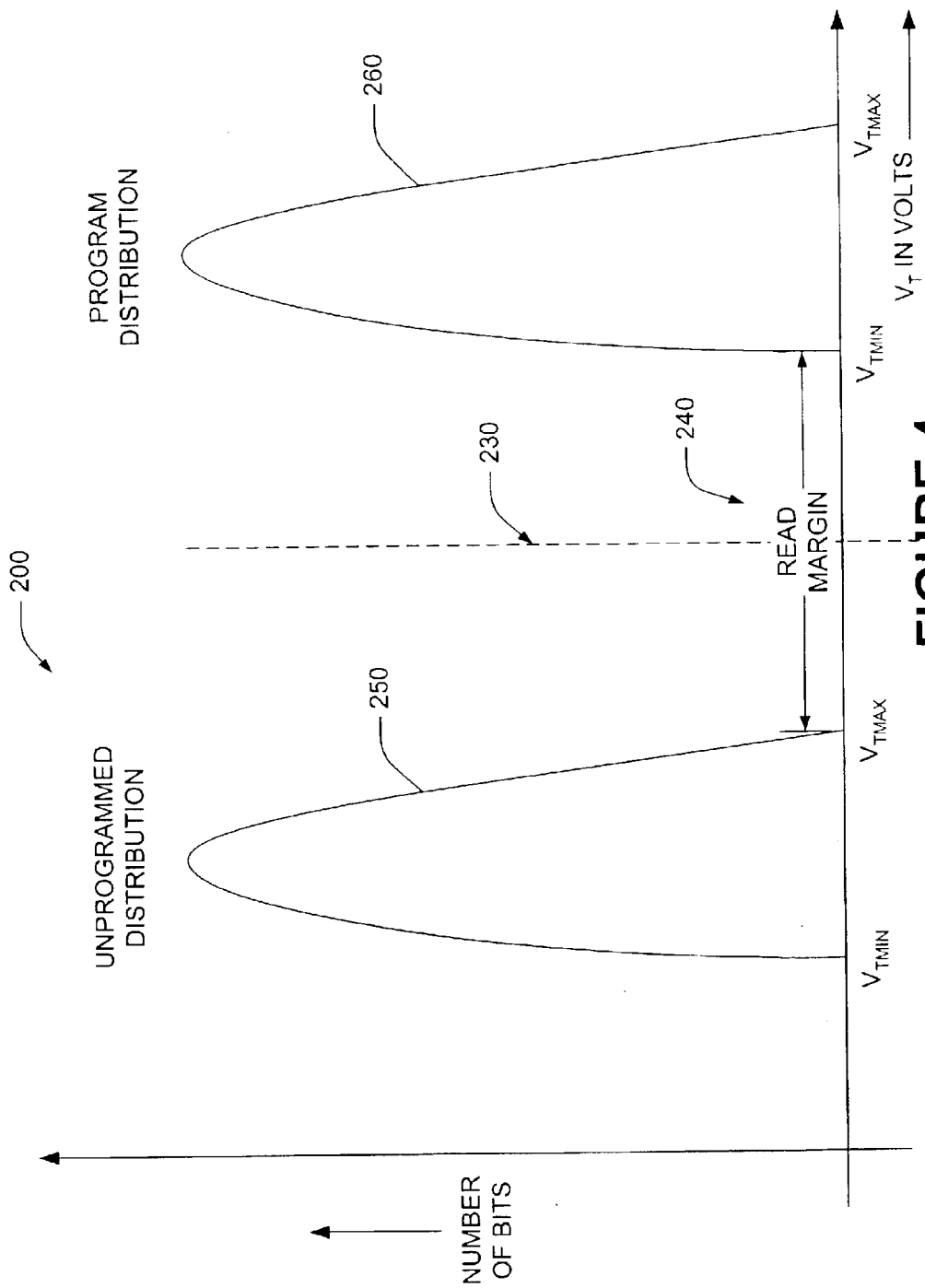
FIG. 4 is a distribution plot illustrating a programmed cell threshold voltage distribution and an unprogrammed cell threshold voltage distribution of a number of core cells of an exemplary prior art flash memory array, and a typical read margin between the distribution plots.

FIG. 4 illustrates the need for a widely separated distribution 200 of unprogrammed 250 and programmed 260 memory cell threshold voltages. In the read mode operation, a read mode word line voltage 230 is selected somewhere midway within the read margin 240. This word line voltage 230 is then applied to the specified word line to see whether or not the flash cell of interest is conducting and thus provide a determination as to whether the cell threshold is above the word line voltage and therefore the cell is programmed, or below the word line voltage and therefore the cell is unprogrammed.

If the boosted word line voltage that is applied to a cell for this analysis is subject to variations with the $V_{CC}$ supply, then the determination as to whether or not the cell is programmed will also be subject to uncertainty, because the word line voltage may exit the read margin 240 of FIG. 4. In a read mode operation that uses a reference cell, although the absolute value of the boost voltage can be outside the read margin window 240, the variation of the wordline voltage can still cause a read margin reduction due to gm-degradation of the core cells after cycling. Adding additional uncertainty to the cell read mode determination, the reference voltages applied to the boosted voltage boost circuit voltage will also, as discussed above, reflect some function of the $V_{CC}$ supply variations.

Figure 5:
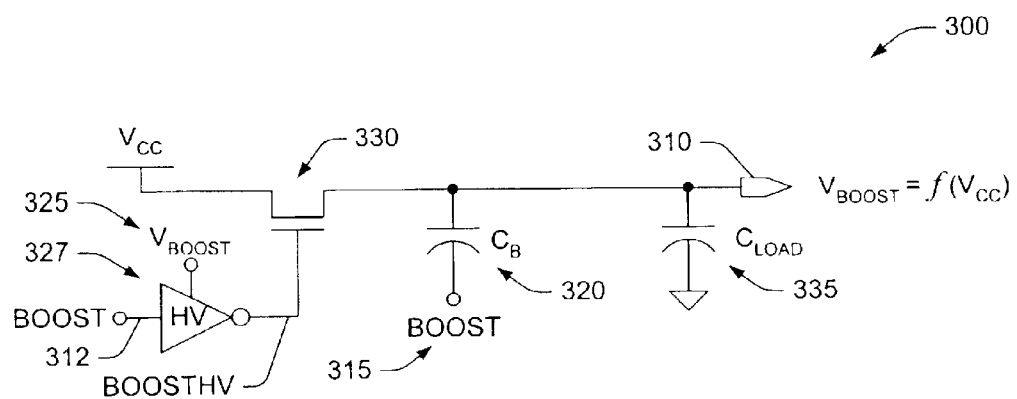
FIG. 5 is a simplified schematic illustration of an exemplary prior art voltage booster circuit for reading a memory cell.

FIG. 5 illustrates a prior art voltage booster circuit 300 for feeding the word line in a memory cell read operation. During an address transition pulse (ATD) time period (not shown), a BOOST signal 312 goes low, and a BOOSTHV signal which is generated with a high voltage inverter 327, goes high. A $V_{BOOST}$ potential 325 on the high voltage inverter 327 causes saturated conduction of an n-mos transistor 330, for example, whereby the $V_{CC}$ conducts substantially through transistor 330 to precharge the boost capacitor $C_B$ at 320 and load capacitor $C_L$ at 335 to $V_{CC}$ while the BOOST terminal 315 is held at ground. At the end of the ATD time period, the BOOST signal 312 commands the transistor 330 to turn-off by going high, and the BOOST terminal 315 is switched from ground to $V_{CC}$. Therefore, the charge voltage on the boost capacitor is now added to the $V_{CC}$ voltage to force a charge sharing between $C_B$ and $C_L$ such that a new voltage is generated at the $V_{BOOST}$ terminal 310 which is greater than $V_{CC}$ but less than twice $V_{CC}$. The actual $V_{BOOST}$ terminal 310 voltage can be calculated as follows:

From: Q=CV therefore; $Q_B = C_B V_{CC}$ and $Q_L = C_L V_{CC}$ after $V_{BOOST}$ has settled, the total charge will be:

$Q_{TOTAL}(final) = Q_{TOTAL}(initial)$ $Q_{TOTAL}(final) = (V_{BOOST} - V_{CC})C_B + V_{BOOST} C_L$ therefore:

$(V_{BOOST} - V_{CC})C_B + V_{BOOST} C_L = (C_B + C_L) V_{CC}$ solving for $V_{BOOST}$: $V_{BOOST} = ((2C_B + C_L)/(C_B + C_L)) V_{CC}$ as a simple example, where $C_B = C_L = C$, we have:

$V_{BOOST} = (3C/2C) V_{CC}$ $V_{BOOST} = (3/2) V_{CC}$

Intuitively, then, we prove that $V_{BOOST}$ would result in a voltage mid-way between $V_{CC}$ and $2V_{CC}$ for the prior art voltage booster. Note, however, that $V_{BOOST}$ is a function of $V_{CC}$ as well as the values of $C_B$ and $C_L$. Therefore, as $V_{CC}$ varies, the boost voltage output $V_{BOOST}$ will also vary. As discussed above, such variations in $V_{BOOST}$ are undesirable since they can lead to read errors.

Figure 6:
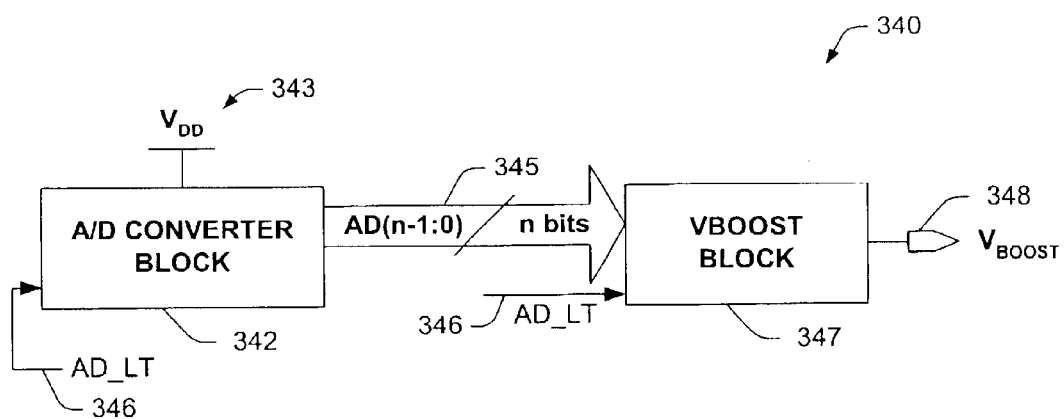
FIG. 6 is a system level functional block diagram illustrating an exemplary regulated voltage booster system in which various aspects of the invention may be carried out.

In accordance with several aspects of the invention, FIG. 6 illustrates a system level functional block diagram of an exemplary regulated voltage booster system 340, for example, for feeding the word line in a memory cell read operation. An A/D converter 342 measures the supply voltage VDD 343, determines and outputs a digital code comprising "n bits" which forms a digital word 345 associated with the level of the supply voltage $V_{DD}$ 343. The digital word 345 is latched to the output of the A/D converter 342 with the arrival of an A/D latch signal AD_LT 346, which further latches digital word 345 to the inputs of a voltage boost circuit 347 signaling that the A/D digital word 345 is available.

Voltage boost circuit 347 then provides a boosted voltage at a $V_{BOOST}$ output terminal 348 that is compensated according to the detected $V_{DD}$ 343 and the bits of the digital word 345. Each bit of the digital word 345 may be used to control a separate boost cell within the boost circuit 347 to provide compensation to the boost circuit output $V_{BOOST}$ 348. Therefore, the output $V_{BOOST}$ 348 is regulated to the $V_{DD}$ 343 in an iterative fashion based on the number of voltage detection and compensation elements (e.g., boost capacitors, boost cells, boost cell stages) desired. The resolution of the compensation desired may be adjusted to fit the specific requirements of the boosted voltage usage, for example, by increasing from a 4 bit to an 8 bit A/D converter.

Figure 7A:
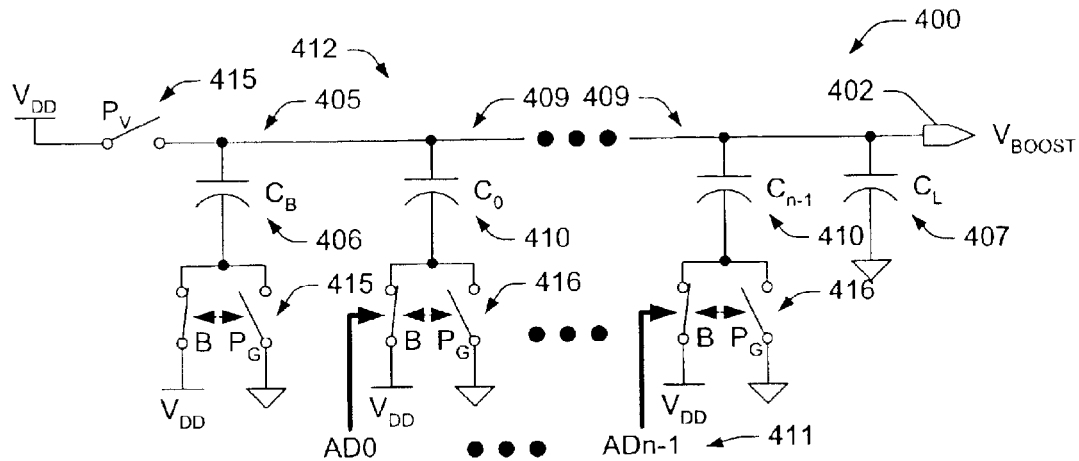
FIG. 7A is a simplified schematic illustration of an exemplary equivalent circuit of a single stage voltage booster circuit similar to that of FIG. 6 in accordance with another aspect of the invention.

FIG. 7A illustrates a simplified schematic diagram of an exemplary equivalent circuit for a single stage voltage boost circuit 400 similar to that of the regulated voltage booster 340 of FIG. 6, and functioning similar to that generally described in association with FIG. 6. The voltage boost circuit 400 comprises a precharge circuit, a plurality of boost cells, and a timing control circuit (not shown). The $V_{BOOST}$ compensated output 402 is a function of fixed boost circuit components comprised of a fixed boost cell 405 having a fixed boost capacitor $C_B$ 406, and a load capacitor $C_L$ 407 (e.g., representative of the word line load capacitance), and is supplemented with a plurality of boost cells 409 having boost capacitors $C_{0 \ldots n-1}$ 410 which provide voltage boost compensation. The plurality of boost cells 409 take their inputs from the AD0 thru ADn−1 digital word inputs 411 from, for example, the A/D converter 342 of FIG. 6. Collectively, the plurality of boost cells 409 which have A/D bit inputs from the digital word 411 may also be referred to as a compensation circuit 412, since the boost cells 409, unlike the fixed boost cell 405, are operable to provide compensation to the voltage boost output 402 from the digital word (e.g., 345 of FIG. 6).

The plurality of boost cells 409 are individually selected for boost compensation by a respective input of the AD0 thru ADn−1 digital word 411 from the stable latched A/D output. The compensation circuit 412 is operable to switch the boost capacitors $C_{0 \ldots n-1}$ 410 between $V_{DD}$ and ground depending on the detected supply level. During the ATD time period, B/$P_G$ switches 415 and 416 close on the precharge ($P_G$) side and open on the boost (3) side. The $V_{DD}$ voltage precharges the load capacitor $C_L$ 407 and the fixed boost capacitor $C_B$ 406, along with the boost capacitors $C_{0 \ldots n-1}$ 410, which are also grounded by the B/P switches 415 and 416 in the $P_G$ selection. Further, each fixed boost capacitor $C_B$ 406, or boost capacitor $C_{0 \ldots n-1}$ 410, has a pull-up precharge switch $P_V$ (e.g., a transistor) coupleable to $V_{DD}$, a grounding precharge switch $P_G$ (e.g., a transistor) coupleable to a ground potential, and a boost switch B coupleable to a boost potential (erg, V)D).

At the end of the ATD time period, a Pre-BOOST time period begins wherein the B/$P_G$ switch 415 and a predetermined set of the B/$P_G$ switches 416 open on the precharge $P_G$ side and close on the boost B side. During this Pre-BOOST time period the fixed boost capacitor $C_B$ 406 is switched back to $V_{DD}$, along with the predetermined set of the boost cells 410. The A/D digital word data is not yet available during this time, but the fixed boost capacitor $C_B$ 406, along with the predetermined set of boost capacitors $C_{0\ldots n-1}$ 410, which are also now switched to $V_{CC}$, begin to boost the voltage to the $V_{BOOST}$ compensated output 402. At this point, if these precharged capacitors were not connected to the load capacitors, $V_{BOOST}$ would be elevated to $2V_{DD}$, however, load capacitor $C_L$ 407, is still held at ground, and the nonselected (nonpredetermined) boost capacitors of 410 are now switched to ground. This forces all the precharge stored in $C_B$, $C_L$, and the selected $C_{0\ldots n-1}$ n capacitors to charge share among all the capacitors on the $V_{BOOST}$ output 402 bringing the boosted voltage to an intermediate level between $V_{DD}$ and $2V_{DD}$.

When the A/D word data is subsequently made available, during the BOOST time period, the selected bits of AD0 thru ADn-1 411 enable selected boost cells 409 with boost capacitors $C_{0\ldots n-1}$ 410 to trim up or trim down the $V_{BOOST}$ output 402 bringing the boosted voltage to a final level between $V_{DD}$ and $2V_{DD}$ corresponding to the $V_{DD}$ as measured by the A/D, thereby resulting in a boosted word line voltage which is substantially independent of variations in the supply voltage.

Figure 7B:
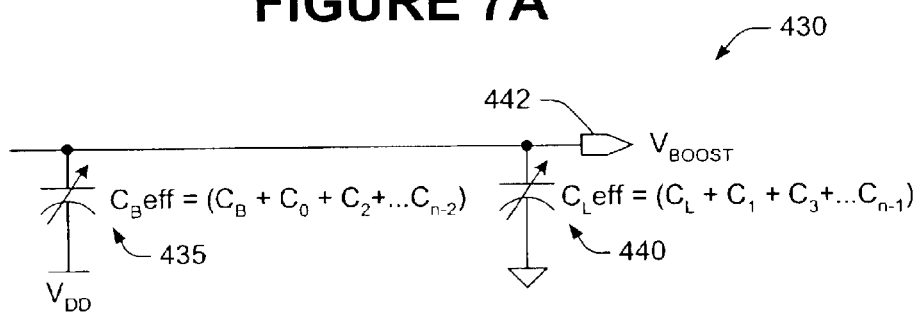
FIG. 7B is a simplified'schematic illustration of an exemplary equivalent circuit of the single stage voltage booster circuit of FIG. 7A in accordance with another aspect of the invention.

FIG. 7B is a schematic illustration of an equivalent circuit of an exemplary voltage booster 430 in accordance with one aspect of the invention, and as described in FIG. 7A for the single stage voltage boost circuit 400. The equivalent circuit 430 demonstrates the result of the final selection made by the A/D converter in the voltage boost circuit 400 in accordance with an aspect of the present invention. The voltage boost circuit 400 of FIG. 7A adjusts or alters an effective boost capacitance $C_B$eff and an effective load capacitance $C_L$eff, thereby resulting in a boosted word line voltage $V_{BOOST}$ which is substantially independent of variations in the supply voltage $V_{DD}$. As this altering provides an adjustment of the output voltage based on the ratio established by selection between the effective boost capacitance and the effective load capacitance, an effective altering of a voltage "boost gain" is also established for the voltage boost circuit.

$C_B$eff is the effective total boost capacitance 435 as seen by the boost circuit 430, comprising $C_B$, plus all the A/D selected capacitors $C_0+\ldots C_{n-2}$. $C_L$eff is the effective total load capacitance 440, comprising $C_L$, plus all the voltage detector nonselected capacitors $C_1+\ldots C_{n-1}$ as seen by the boost circuit 430 and impressed on the $V_{BOOST}$ 442 boosted voltage output line. Therefore the effective boost capacitance $C_B$eff and effective load capacitance $C_L$eff is a function of $V_{DD}$. Note that FIG. 7B illustrates a set of arbitrary examples for $C_B$eff and $C_L$eff.

Therefore, the effective $V_{BOOST}$ terminal voltage 442 of FIG. 7B for one arbitrary example of the present invention becomes:

From: $V_{BOOST}=((2C_B+C_L)/(C_B+C_L))V_{DD}$
We have: $V_{BOOST}=((2C_B\text{eff}+C_L\text{eff})/(C_B\text{eff}+C_L\text{eff}))V_{DD}$
where: $C_B\text{eff}=C_B+C_0+\ldots C_{n-2}$ (of selected boost capacitors)
and where: $C_L\text{eff}=C_L+C_1+\ldots C_{n-1}$ (of nonselected boost capacitors)

It should be noted, that the total number of capacitors used in this exemplary method remains constant.

Figure 8:
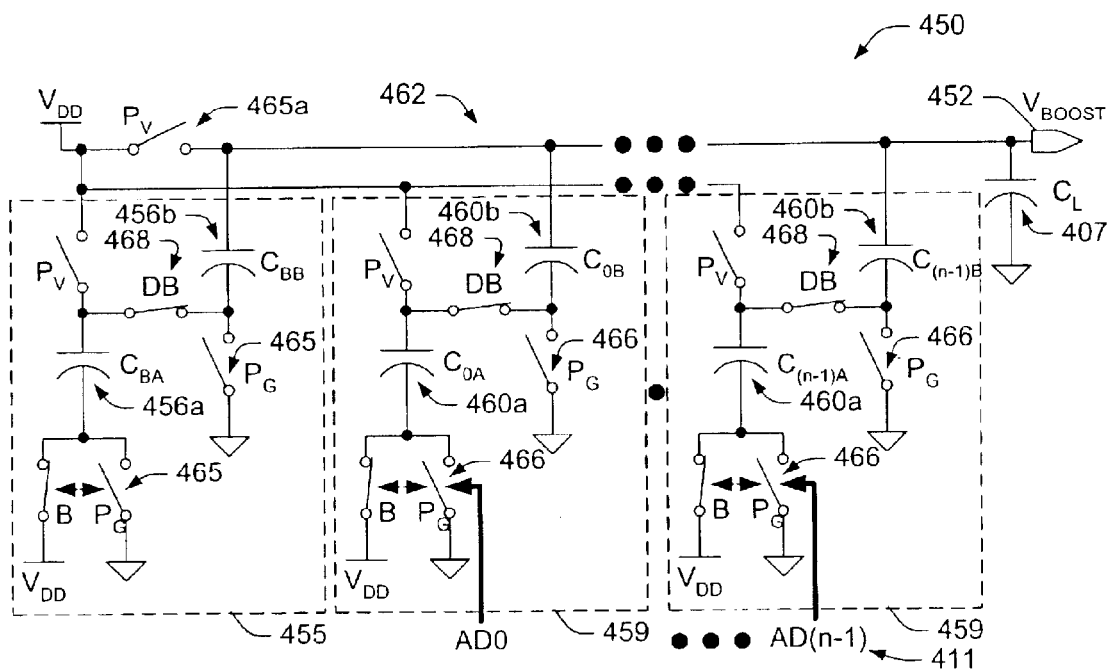
FIG. 8 is a simplified schematic illustration of an exemplary equivalent circuit of a two-stage voltage booster circuit similar to that of FIG. 6 in accordance with another aspect of the invention.

FIG. 8 illustrates a simplified schematic diagram of an exemplary equivalent circuit for a two stage voltage boost circuit 450 similar to that of the regulated voltage booster 340 of FIG. 6 in which various aspects of the invention may be carried out. Boost circuit 450 also functions similar to that generally described in association with FIG. 7A, except that the two stage booster permits boosting to a maximum final level of $3V_{DD}$ rather than the final level of between $V_{DD}$ and $2V_{DD}$ as described for FIG. 7A. Voltage boost circuit 450 comprises a precharge circuit, a plurality of, for example, two stage boost cells and a timing control circuit (not shown). The $V_{BOOST}$ compensated output 452 is again, a function of fixed boost circuit components comprised of a fixed two stage boost cell 455, and the load capacitor $C_L$ 407, and is supplemented with a plurality of boost cells 459 to provide double stage voltage boost compensation. The fixed two stage boost cell 455 comprises fixed boost capacitors $C_{BA}$ 456a and $C_{BB}$ 456b, while the plurality of boost cells 459 comprise boost capacitors $C_{0A\ldots(n-1)A}$ 460a and $C_{0B\ldots(n-1)B}$ 460b which are series coupled by coupling switches or transistors (DB) 468 to provide double stage voltage boost compensation. The plurality of boost cells 459 take their inputs from the AD0 thru ADn-1 digital word inputs 411 from, for example, the A/D converter 342 of FIG. 6. Collectively, the plurality of boost cells 459 which have A/D bit inputs from the digital word 411 may also be referred to as a boost compensation circuit 462, since the boost cells 459, unlike the fixed boost cell 455, are operable to provide compensation to the voltage boost output 452 from the digital word (e.g., 345 of FIG. 6).

Again, the plurality of boost cells 459 are individually selected for boost compensation by a respective input of the AD0 thru ADn-1 digital word 411, from the stable latched A/D output. The boost compensation circuit 462 is operable to switch the boost capacitors $C_{0A\ldots(n-1)A}$ 460a between $V_{DD}$ and ground depending on the detected supply level, while $C_{0B\ldots(n-1)B}$ 460b are switched between ground and the output voltage that is generated by $C_{0A\ldots(n-1)A}$ 460a. During the ATD time period, B/$P_G$ switches 465 and 466 close on the precharge $P_G$ side and open on the boost B side. The $V_{DD}$ Voltage precharges the load capacitor $C_L$ 407 and the fixed boost cell 455, along with the boost capacitors $C_{0A\ldots(n-1)A}$ 460a and $C_{0B\ldots(n-1)B}$ 460b, which are also grounded by the B/$P_G$ switches 465 and 466 in the $P_G$ selection. Further, each fixed boost cell 455, or boost cell 459, has a pull-up precharge switch $P_V$ (e.g., a transistor) coupleable to $V_{DD}$, a grounding precharge switch $P_G$ (e.g., a transistor) coupleable to a ground potential, and a boost switch B coupleable to a boost potential (e.g., $V_{DD}$).

At the end of the ATD time period, a Pre-BOOST time period begins wherein the B/$P_G$ switch 465 and a predetermined set of the B/$P_G$ switches 466 open on the precharge $P_G$ side and close on the boost B side. During this Pre-BOOST time period the fixed boost capacitance $C_B$ 406 is switched back to $V_{DD}$, along with the predetermined set of the boost cells 410. The A/D digital word data is not yet available during this time, but the fixed boost capacitors $C_{BA}$ 456a and $C_{BB}$ 456b, along with the predetermined set of boost capacitors $C_{0A\ldots(n-1)A}$ 460a and $C_{0B\ldots(n-1)B}$ 460b are series coupled by coupling transistors DB 468, while the $C_{0A\ldots(n-1)A}$ 460a set of boost capacitors are switched to $V_{CC}$, to begin the double stage voltage boost compensation to the $V_{BOOST}$ output 452. At this point, if these precharged capacitors were not connected to the load capacitors, $V_{BOOST}$ would be elevated to a maximum of $3V_{DD}$ (e.g., $V_{DD}+V_{C0A\ldots(n-1)A}+V_{COB\ldots(n-1)B}$), however, load capacitor $C_L$ 407, is still held at ground, and the nonselected (nonpredetermined) boost capacitors of $C_{0A\ldots(n-1)A}$ 460a and $C_{0B\ldots(n-1)B}$ 460b are now switched to ground. This forces all the precharge stored in $C_{BA}$ and $C_{BB}$, $C_L$, and the selected $C_{0A\ldots(n-1)A}$ and $C_{0B\ldots(n-1)B}$ capacitors to charge share among all the capacitors on the $V_{BOOST}$ output 452 bringing the boosted voltage to an intermediate level between $V_{DD}$ and $3V_{DD}$.

When the A/D word data is subsequently made available, during the BOOST time period, the selected bits of AD0 thru ADn−1 411 enable selected boost cells 459 to trim up or trim down the $V_{BOOST}$ output 452 bringing the boosted voltage to the final level corresponding to the $V_{DD}$ as measured by the A/D, thereby resulting in a double stage boosted word line voltage which is substantially independent of variations in the supply voltage. Thus, for the same reasons that the single stage boost circuit 400 of FIG. 7A has the equivalent circuit 430 of FIG. 7B, the double stage boost circuit 450 of FIG. 8 similarly corresponds to the equivalent circuit 430 of FIG. 7B, wherein adjusting or altering an effective boost capacitance $C_B$eff and an effective load capacitance $C_L$eff, results in a boosted word line voltage $V_{BOOST}$ which is substantially independent of variations in the supply voltage $V_{DD}$. Therefore, the ratio between the effective boost capacitance and the effective load capacitance may be altered corresponding to the $V_{DD}$ to further alter a voltage "boost gain" of the voltage boost circuit 450.

Figure 9:
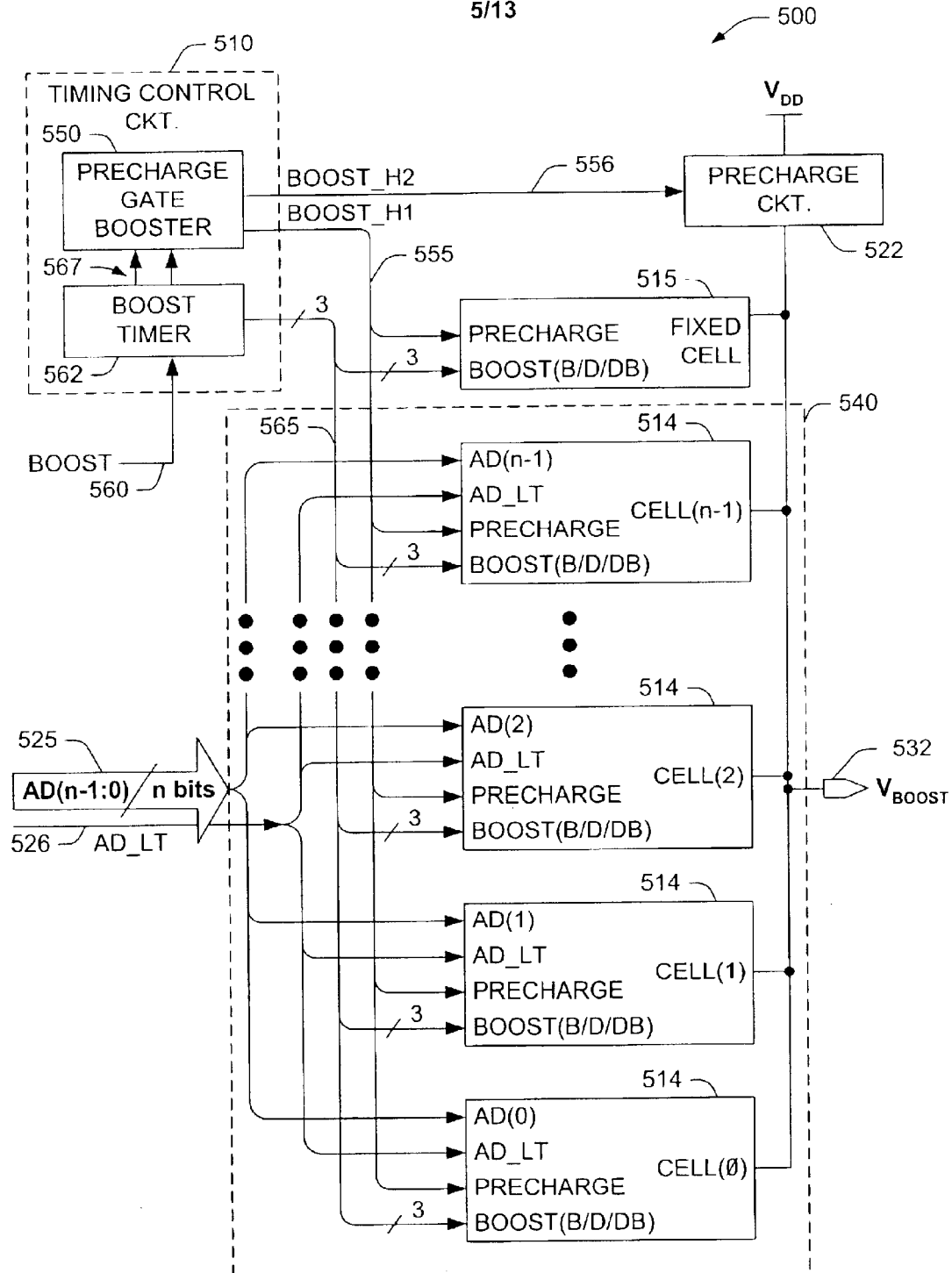
FIG. 9 is a system level functional block diagram illustrating an exemplary multi-bit two stage regulated voltage booster using a digital multi-bit input in which various aspects of the invention may be carried out.
Figure 10:
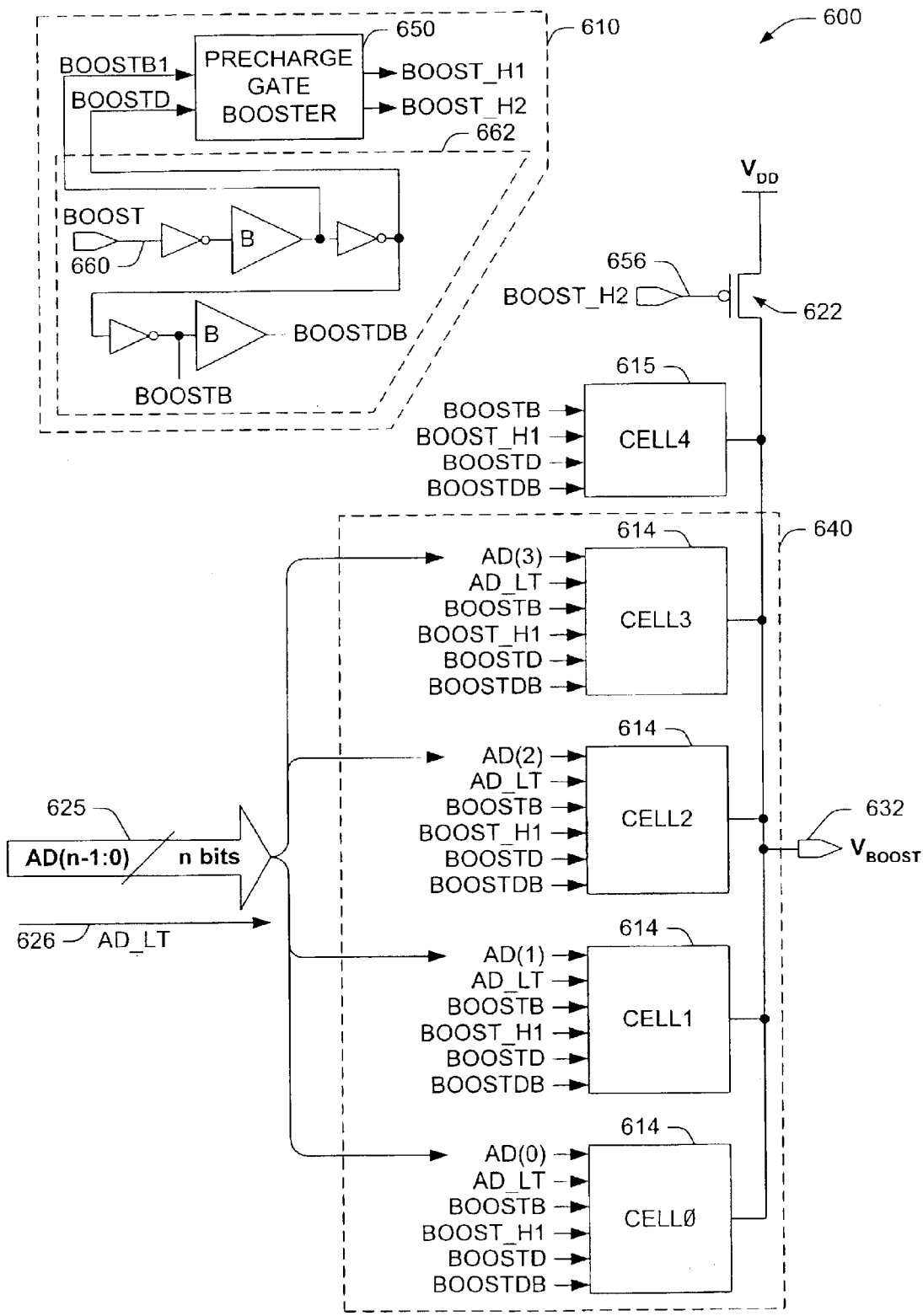
FIG. 10 is another system level functional block diagram illustrating an exemplary four bit two stage regulated voltage booster using a digital four bit input, including a precharge gate booster and a boost timer, in which various aspects of the invention may be carried out.

FIGS. 9 and 10 illustrate a system level functional block diagram of an exemplary multi-bit two stage regulated voltage booster 500, and an exemplary four bit two stage regulated voltage booster 600, respectively, in which various aspects of the invention may be carried out. Both voltage boost circuits 500 and 600 function similar to that generally described in association with FIG. 8, wherein using, for example, a two stage booster permits boosting to a maximum final level of $3V_{DD}$, wherein the ratio of the effective boost capacitance to the effective load capacitance may be altered corresponding to a measured $V_{DD}$ value. Although a two stage voltage boost circuit is illustrated, it is also appreciated that a multi-stage and a multi-bit regulated booster is anticipated in the scope of the present invention.

In FIG. 9, voltage boost circuit 500 comprises a timing control circuit 510, a plurality of, for example, two stage boost cells (e.g., cell(0)-cell(n−1) 514 and a fixed two stage boost cell 515), a precharge circuit 522, and inputs AD0 thru ADn−1 525 from, for example, a digital word 345. The circuit 500 is operable to generate a $V_{BOOST}$ compensated output 532 corresponding to a measurement of the $V_{DD}$ value. The $V_{BOOST}$ compensated output 532 is again, a function of fixed boost circuit components comprised of the fixed two stage boost cell 515, and the load capacitor $C_L$ (not shown) as reflected by the word line capacitance at $V_{BOOST}$. $V_{BOOST}$ compensated output 532 is supplemented with a plurality of double stage boost cells 514 to provide double stage voltage boost compensation. Each of the two stage boost cells 514 and 515 comprise two boost capacitors which are series coupled by a coupling transistor to provide double stage voltage boost compensation to a common node at the $V_{BOOST}$ compensated output 532. The plurality of boost cells 514 take their inputs from the AD0 tlin ADn−1 digital word inputs 525 from, for example, the A/D converter 342 of FIG. 6. The inputs 525 of the digital word are recognized as presently available for use by the voltage booster circuit 500 by the presence of an A/D latch signal AD_LT input signal 526. Collectively, the plurality of boost cells 514 which have A/D bit inputs 525 from, for example, the digital word 345 may also be referred to as a boost compensation circuit 540 (or, e.g., the selectable boost cells), since the boost cells 514, unlike the fixed boost cell 515, are operable to provide compensation to the voltage boost output 532 from the digital word (e.g., 345 of FIG. 6).

The timing control circuit 510 of the voltage boost circuit 500 FIG. 9, controls the precharge and boost timings previously described in a general context. The timing control 510 comprises a precharge gate booster 550 for providing a boosted gate signal BOOST_H1 555 for a precharge switch within the compensation circuit 540 boost cells 514 and within the fixed boost cell 515, and a boosted gate signal BOOST_H2 556 of the precharge circuit 522. Initialized by a BOOST signal 560, the timing control 510 further comprises a boost timer 562 for enabling three BOOST(B/D/DB) timing signals 565 to control a PREBOOST timing and a BOOST timing in boost cells 514 and 515, and two BOOST(B1/D) timing signals 567 used to synchronize the precharge gate booster 550. The PREBOOST timing of the timing control circuit 510 provides the control for initializing the predetermined set of boost cells to begin boosting before the digital inputs 525 are acknowledged as available by the AD_LT input signal 526 providing anticipation of the final $V_{BOOST}$ compensated output 532. For example, one or more of the cells(n−1:0) may be predetermined by internal logic or other external logic circuits to provide the anticipatory preboost as needed before the arrival of the AD_LT input signal 526 which denotes the beginning of the BOOST timing.

As discussed, FIG. 10 illustrates an exemplary four bit two stage regulated voltage booster 600 using a corresponding four bit digital input, in one aspect of the present invention. As voltage booster 600 is one exemplary implementation of voltage booster 500 of FIG. 9, booster 600 may not be described again in full detail for the sake of brevity. The voltage boost circuit 600 of FIG. 10 also comprises a timing control circuit 610, a plurality of, for example, two stage boost cells (e.g., (cell(0)-cell(3) 614 and cell(4) 615), a precharge circuit 622 (e.g., a switch transistor), and inputs AD0 thru ADn−1 625 from, for example, a digital word 345 are operable to direct a $V_{BOOST}$ compensated output 632 corresponding to a measurement of the $V_{DD}$ value. The $V_{BOOST}$ compensated output 632 is again, a function of fixed boost circuit components comprised of a fixed two stage boost cell 615, and the load capacitor $C_L$ (not shown) as reflected by the word line capacitance at $V_{BOOST}$. $V_{BOOST}$ compensated output 632 is supplemented with a plurality of double stage boost cells 614 to provide double stage voltage boost compensation.

The inputs 625 of the digital word are made available for use by the voltage booster circuit 600 with the presence of an A/D latch AD_LT input signal 626. Collectively, the plurality of boost cells 614 having A/D bit inputs 625 provide a boost compensation circuit 640, and provide compensation to the voltage boost output 632.

The timing control circuit 610 of FIG. 10, controls the precharge and boost timings and comprises a precharge gate booster 650 for providing a boosted gate signal BOOST_H1 to a precharge transistor in the compensation circuit 640 boost cells 614 and to the fixed boost cell 615, and a boosted gate signal BOOST_H2 to the precharge circuit transistor 622. Initialized by a BOOST signal 660, the timing control 610 further comprises a boost timer 662 for enabling a BOOSTB, a BOOSTD, and a BOOSTDB timing signal to control a PREBOOST timing and a BOOST timing in boost cells 614 and 615, and a BOOSTB1, and a BOOSTD timing signals 667 used to synchronize the precharge gate booster 650.

The PREBOOST timing of the timing control circuit 610 provides, according to one aspect of the present invention, control for initializing a predetermined set of boost cells to begin boosting before the digital inputs 625 are acknowledged as available by the AD_LT input signal 626 providing anticipation of the final $V_{BOOST}$ compensated output 632. For example, boost cell3 and cell2 (e.g., cells(3:2)) may be predetermined by logic circuits internal to the boost cell to provide the anticipatory preboost as needed before the arrival of the AD_LT input signal 626 which denotes the beginning of the BOOST timing, as will be shown in greater detail in connection with FIG. 11.

Figure 11:
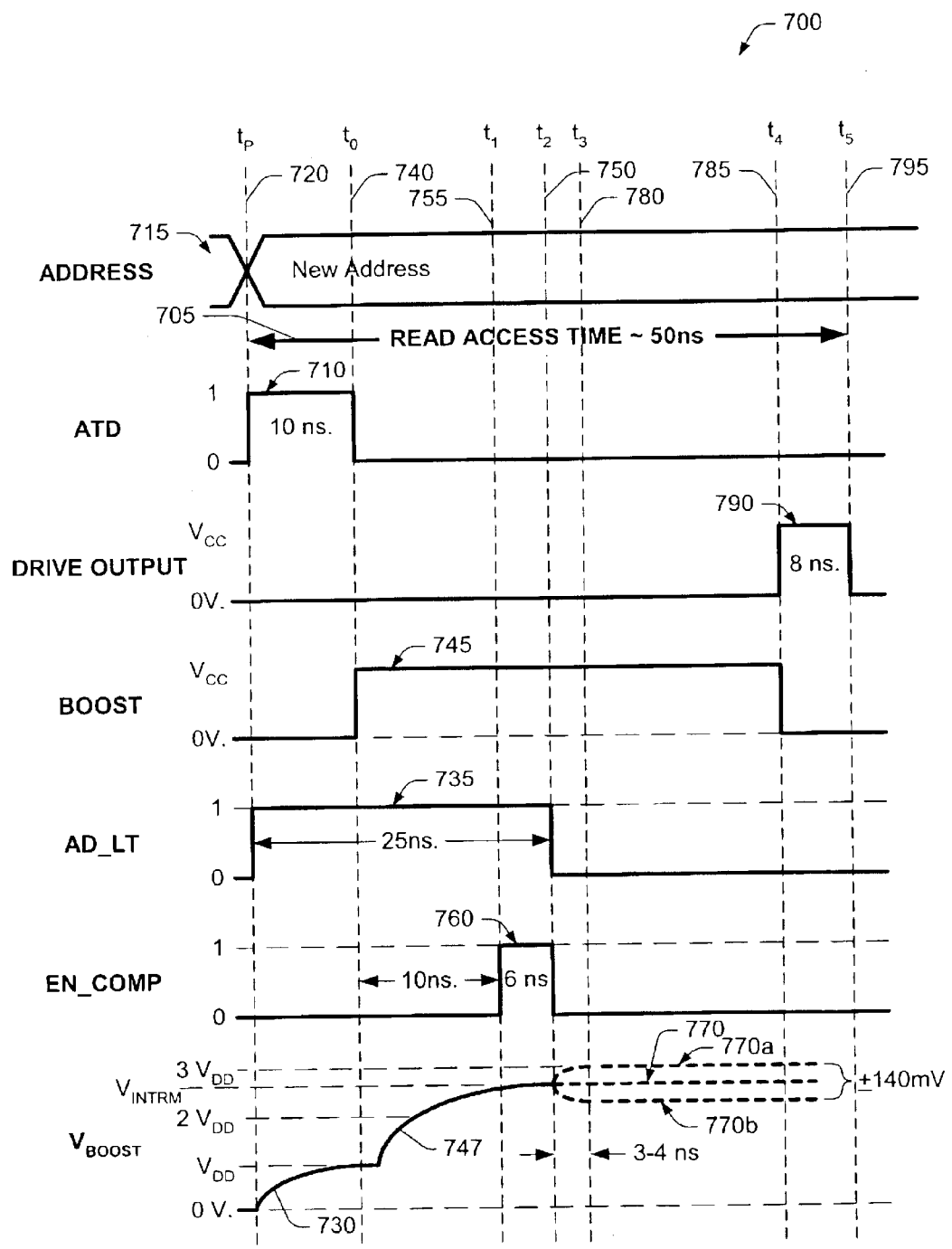
FIG. 11 is a simplified timing diagram illustrating exemplary read mode timings and output of the voltage booster of FIG. 10.

FIG. 11 demonstrates an exemplary timing diagram 700 for the read mode timings and output of the exemplary two stage voltage booster circuits of FIGS. 9 and 10. Portions of the timing diagram of FIG. 11 will be used to describe the operation of FIGS. 8 and 9, and other portions of the timing diagram of FIG. 11 will be used as a reference to explain the operations of an exemplary system of FIGS. 10 and following, according to the invention.

The timing of the voltage booster of FIGS. 9 and 10 is relative to that of the read access timing 705 that is about 50 ns as depicted in timing diagram 700 of FIG. 11. For a new access, an address transition pulse (ATD) 710 is generated when a new address 715 is applied at time $t_p$ (720) of FIG. 11. The address transition pulse ATD 710, goes high for about 10 ns during which time all boosting capacitors (e.g., $C_{0-(n-1)A}$, and $C_{0-(n-1)B}$ of FIG. 8) of the boost cells (e.g., 455 and 459 of FIG. 8, or cell0–cell3 (614) and cell4 (615) of FIG. 10) precharge. The ATD 710 time interval is further used to decode the new address 715 at time $t_p$ (720) to a common node of the word line (e.g., 632 of FIG. 10) which also precharges the word line load capacitance $C_L$ (e.g., 407 of FIG. 8) to $V_{DD}$ bringing the final $V_{BOOST}$ output 632 from about 0 volts to about $V_{DD}$, shown along the $V_{BOOST}$ charge curve segment 730 of FIG. 11. Also during the ATD interval 710, the A/D converter block (e.g., 342 of FIG. 6) and the fast reference circuit (not shown) are enabled from the rising edge of the ATD pulse to measure the $V_{DD}$. A/D latch signal AD_LT (735) is also high during the entire A/D converter measurement.

At time t0 (740), ATD goes low again to end the boost capacitor precharge, while the BOOST signal (e.g., 560 of FIG. 10) goes high initiating a preboost period during the initial portion of the BOOST interval 745. During the preboost period at time $t_0$ (740) a few predetermined boost cells (e.g., boost cells(3:2) of FIG. 10), which have logic circuits wired to make this predetermination, begin voltage boosting the word line. In the case of the two stage boost cells, this means that both of the boost capacitors (e.g., $C_{(n-1)A}$ 460a and $C_{(n-1)B}$ 460b of FIG. 8) are coupled in series, while the noncoupled terminal of $C_{(n-1)A}$ (460a) is switched to $V_{DD}$, forcing boost capacitor $C_{(n-1)B}$ (460b) to share its charge plus the $V_{DD}$ supply voltage with load capacitor $C_L$ (407) so that the $C_{(n-1)A}$, $C_{(n-1)B}$, and $C_L$ charge share to a value between $V_{DD}$ and $3V_{DD}$, as shown along the $V_{BOOST}$ charge curve segment 747 between $t_0$ (740) and $t_2$ (750). Thus a predetermined set of boost cells begin boosting before the digital inputs 625 are made available with the AD_LT input signal 735 to anticipate the final $V_{BOOST}$ compensated output (e.g., 632 of FIG. 10).

Since speed is a high priority during the read operations, the inventors have also taken advantage of the PREBOOST portion of the BOOST signal timing interval 745 of the present invention, to detect the $V_{DD}$ using the A/D converter, so that time is not wasted separately measuring the $V_{DD}$ and charging the compensation capacitors of the boost cells. The initial PREBOOST timing is therefore used to preboost the boost capacitors and load capacitors to anticipate the final $V_{BOOST}$ compensated output, and is also used to detect the value of $V_{DD}$.

As the A/D converter finishes measuring the $V_{DD}$ value, the A/D comparator outputs are latched at $t_2$ (750) to ensure a stable output voltage wherein the outputs of the comparators (e.g., the digital word 625 of FIG. 10) are then enabled with an enable comparators signal EN_COMP 760 for about 6 ns, for example, between times $t_1$ (755) and $t_2$ (750).

At time $t_2$ (750), AD_LT (735) (e.g., or 626 of FIG. 10) goes low as the A/D conversion measurement of the $V_{DD}$ data present on the A/D converter is latched to the output of the A/D converter and to the inputs (e.g., the inputs AD0 thru ADn–1 of digital word 625 of FIG. 10) and enabled by AD_LT (735). Thus, at time $t_2$ (750), the final selection of the boost cells (e.g., cell(3:0)) may be made and these boost cells may further alter the final compensated $V_{BOOST}$ output voltage 632 as shown by the $V_{BOOST}$ curve segments 770, 770a and 770b. For example, $V_{BOOST}$ curve segment 770 illustrates that no final change of compensation was required to the digital word 625 from that of the predetermined set of selected boost cells. $V_{BOOST}$ curve segment 770a indicates that further boosting was required, while $V_{BOOST}$ curve segment 770b indicates that further loading was required to reduce $V_{BOOST}$ with a corresponding greater or lesser digital word 625 value, respectively. As previously discussed, the range here of the output $V_{BOOST}$ voltage value for a typical two stage voltage booster is in the range of between $V_{DD}$ and $3V_{DD}$.

By time $t_3$ (780), approximately 3–4 ns after time $t_2$ (750), the final $V_{BOOST}$ value has been achieved by the compensation circuit 640 according to the digital word 625. The digital word value dictates which cells 514, 614 are ultimately employed to provide the boost to the final value. At time $t_4$ (785), BOOST (745) goes low again and the read drive output DRIVE OUTPUT 790 goes high for about 8 ns during the actual memory read operation until the end of the read access time 705 at time $t_5$ (795).

Figure 12:
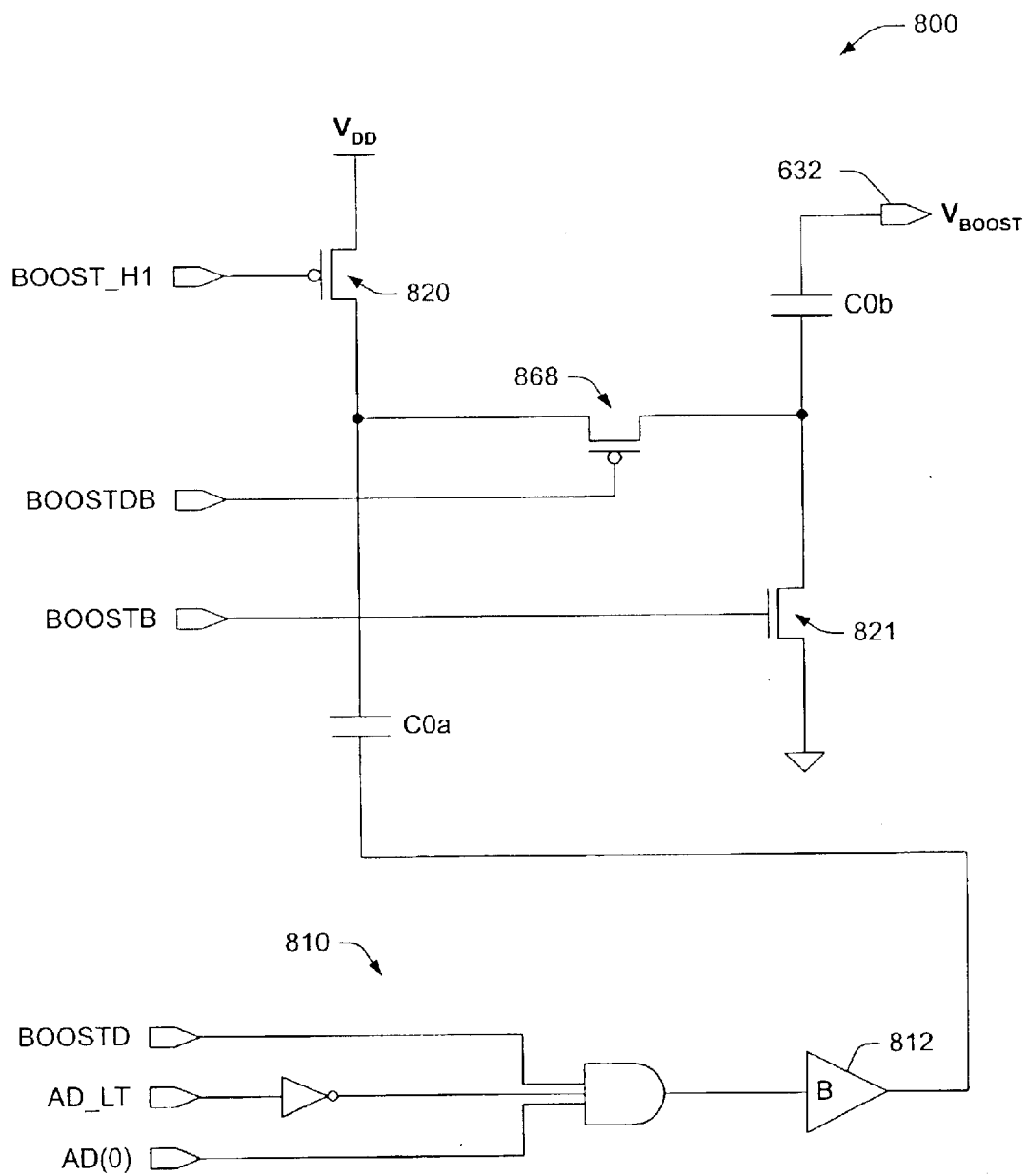
FIG. 12 is a schematic illustration of a two-stage voltage boost cell for the least significant bits of an exemplary regulated voltage booster using digital supply voltage compensation in accordance with an aspect of the invention.
Figure 13:
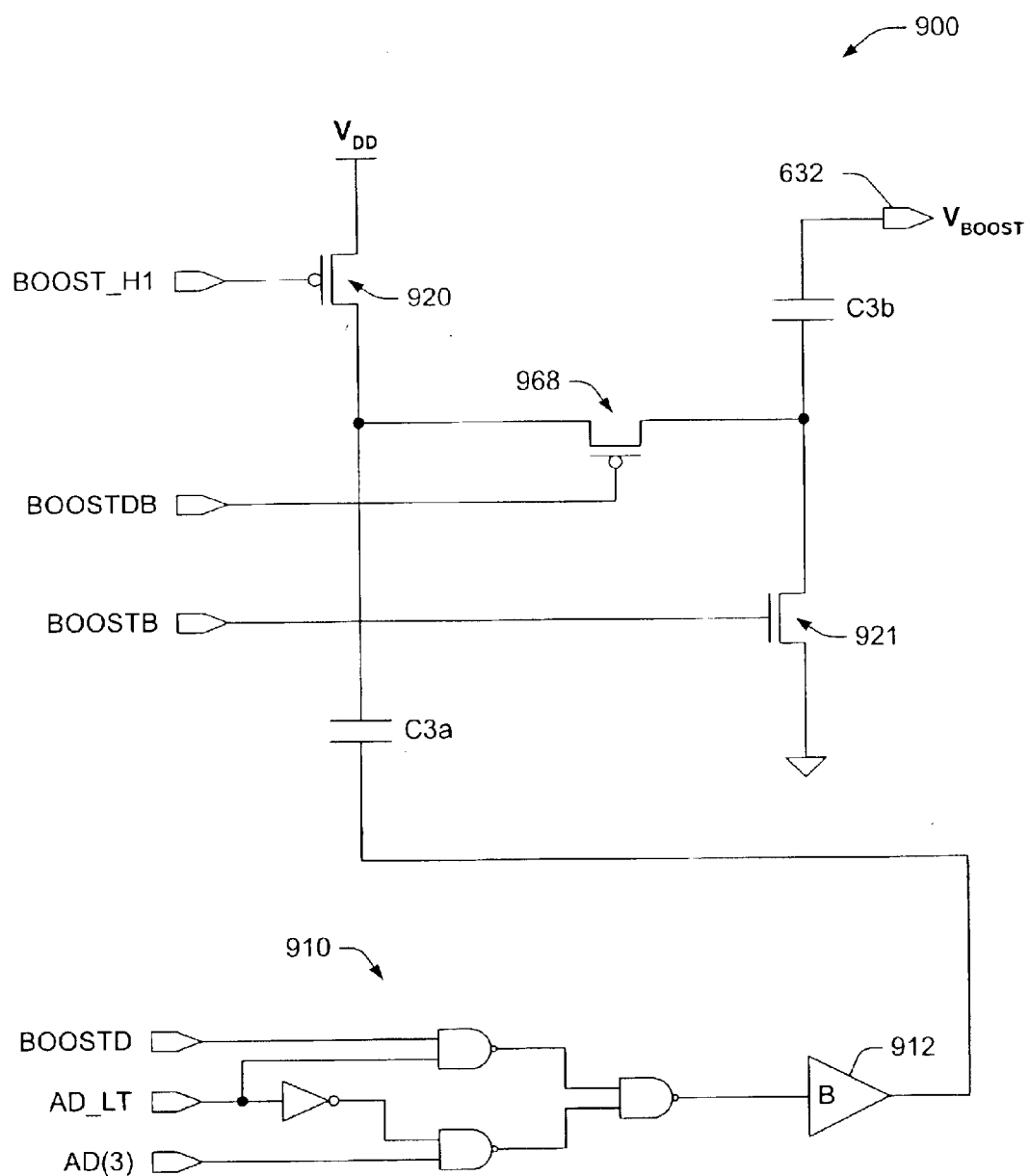
FIG. 13 is a schematic illustration of a two-stage voltage boost cell for the most significant bits of an exemplary regulated voltage booster using digital supply voltage compensation in accordance with an aspect of the invention.
Figure 14:
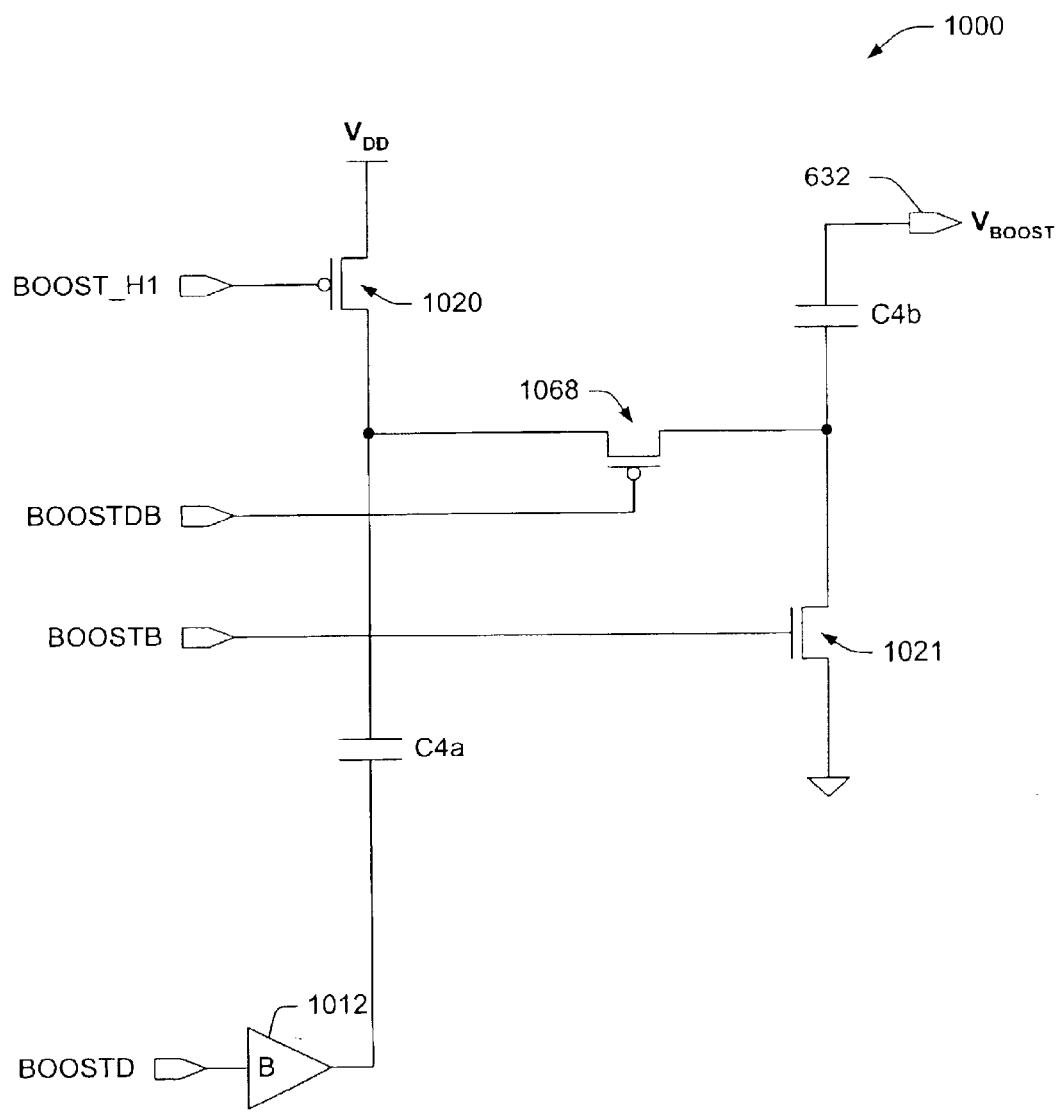
FIG. 14 is a schematic illustration of a two-stage default voltage boost cell of an exemplary regulated voltage booster using digital supply voltage compensation in accordance with an aspect of the invention.

FIGS. 12–14 are schematic illustrations of exemplary two stage voltage booster cells 614 for various bits of the exemplary regulated voltage booster circuit 600 of FIG. 10 for supply voltage compensation, in accordance with an aspect of the invention and the timing diagram 700 of FIG. 11. The booster cells 800 of FIG. 12, and 900 of FIG. 13, are each selectively controlled by one input bit AD0-AD3 of the digital word 625, thus may be also be referred to as "selectable boost cells" (e.g., cell0–cell3, 614). The logic circuitry 810, 910 differ based on what cells will be employed in the pre-boost function, as will be further appreciated below. Booster cell 1000 of FIG. 14 is not controlled by a digital word input bit, because it is always used for boosting to provide a default or minimum boosted voltage output $V_{BOOST}$, and as such may be referred to as the "fixed boost cell" (e.g., cell4, 615). Although the booster cells are illustrated and labeled for application to a specific exemplary input bit (e.g., AD(0) or AD(3)), the booster cell schematics and functionality may apply to any number of input bits of the digital word 625.

For example, boost cell 800 of FIG. 12 comprises logic circuit 810 for selection of the boost cell, a digital input bit, two boost capacitors C0a and C0b for double boosting the $V_{BOOST}$ 632 word line, precharge transistors 820 and 821 to precharge the boost capacitors C0a and C0b, respectively, and coupling transistor 868 for series coupling boost capacitors C0a and C0b. Booster cell 800 of FIG. 12, is selectively controlled using logic circuit 810, by the least significant bits (LSB's) (e.g., AD(0) or AD(1)) of the digital word 625 by providing an input bit AD(0) which is enabled by AD_LT (626 of FIG. 10, and 735 at $t_2$ (750) of FIG. 11). Logic circuit 810 is further enabled by input BOOSTD from the boost timer 662 of the timing control circuit 610 of FIG. 10 when boost cell 800 is to begin boosting the $V_{BOOST}$ word line voltage, if also selected by, for example, AD(0).

Initially, however, boost capacitor C0a of FIG. 12, is precharged to $V_{DD}$ when precharge transistor 820 is enabled by boosted gate signal BOOST_H1 from the precharge gate booster 650 with buffer 812 held low. Boost capacitor C0b is precharged to $V_{DD}$ when precharge circuit transistor 622 is enabled by another boosted gate signal BOOST_H2 (656) from the precharge gate booster 650 via a common node of the $V_{BOOST}$ 632 word line, and when precharge transistor 821 is enabled by BOOSTB from the boost timer 662 of timing control circuit 610 pulling the lower terminal of C0b to ground.

When the boost cell is selected to boost and is enabled by BOOSTDB, coupling transistor 868 couples boost capacitors C0a and C0b in series. About the same time buffer 812 is instructed to go high applying $V_{DD}$ to the lower terminal of the series pair of capacitors. Boost capacitors C0a and C0b are thus forced to charge share adding their $2V_{DD}$ of charge to the $V_{DD}$ supplied by buffer 812, thereby boosting the $V_{BOOST}$ 632 word line to a maximum final level of $3V_{DD}$. However, as discussed previously, as all the boost cells are wired in parallel at a common node, the final boost voltage achieved to the $V_{BOOST}$ 632 word line becomes a function of the ratio of the effective boost capacitance to the effective load capacitance selected corresponding to the measured $V_{DD}$. Booster cell 900 of FIG. 13 and fixed booster cell 1000 of FIG. 14 function similar to that of booster cell 800 of FIG. 12, and as such may not be fully described again for the sake of brevity.

Similarly, booster cell 900 of FIG. 13, is also selectively controlled using logic circuit 910, by the most significant bits (MSB's) (e.g., AD(2) or AD(3)) of the digital word 625 by providing an input bit AD(3) which is enabled by AD LT (626 of FIG. 10, and 735 at $t_2$ (750) of FIG. 11). Logic circuit 910 is further enabled by input BOOSTD from the boost timer 662 of the timing control circuit 610 of FIG. 10, which times and provides a boosted gate voltage to the precharge transistors when boost cell 900 is to begin boosting the $V_{BOOST}$ word line voltage, if also selected by, for example, AD(3). By contrast, however, to the logic circuit 810 of FIG. 12, logic circuit 910 maybe prewired in accordance with an aspect of the present invention as shown, to force the boost cell to boost during the initial PREBOOST timing portion of the BOOST time interval (e.g., between to (740) to $t_2$ (750) of FIG. 11), to anticipate the final $V_{BOOST}$ word line voltage. It should also be noted at this point that even the nonpredetermined boost cells during the preboost interval will at least provide $2V_{DD}$ to the boosted word line voltage, as the output of the buffer 912 will be low and C3a and C3b will be series coupled to charge share their precharge of $V_{DD}$ each.

As previously discussed, fixed booster cell 1000 of FIG. 14 (e.g., cell4, 615) is not controlled by a digital word input bit, because it is always used for boosting to provide a default or minimum boosted voltage output $V_{BOOST}$. The fixed booster cell 1000 is similar to the bit selectable boost cells, except that no logic circuit or digital input bit is present.

Figure 15:
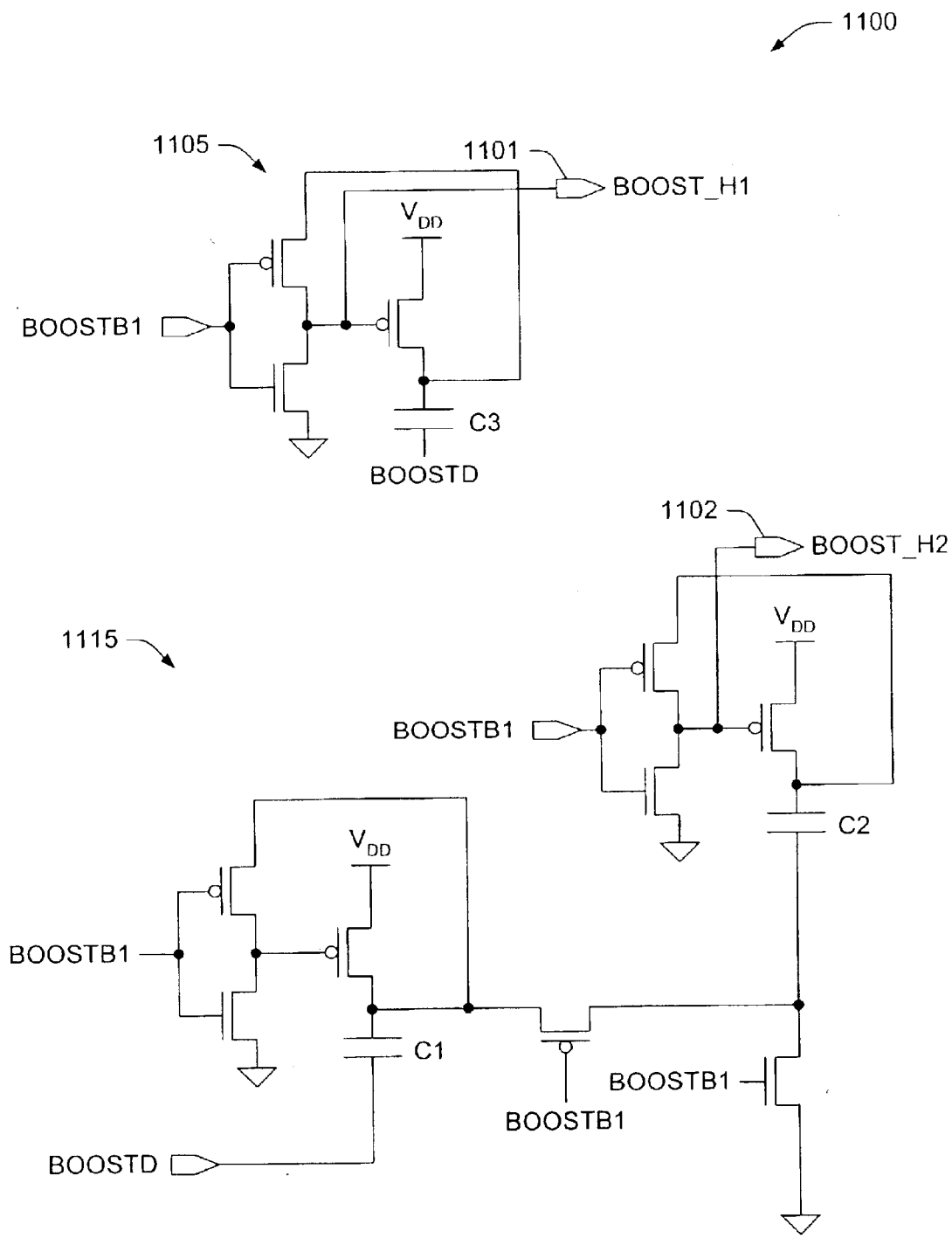
FIG. 15 is a schematic illustration of a precharge gate booster of an exemplary regulated voltage booster in accordance with an aspect of the invention.

FIG. 15 illustrates further details of a precharge gate booster 1100 and the booster 650 of the exemplary regulated voltage booster circuit 600 of FIG. 10 in accordance with an aspect of the invention. Precharge gate booster 1100 provides two boosted gate voltage signals BOOST_H1 (1101) and BOOST_H2 (1102). As the voltage booster of the present invention is able to operate at very low supply voltages, the gate-drive to the transistors used to precharge the boosting capacitors may be small and require high subthreshold leakage transistors. Thus, to insure full conduction and turn-off of these precharge transistors at low supply voltages, a boosted voltage may need to be supplied to the gate of the precharge transistors (e.g., 820 of FIG. 12, and 622 of FIG. 10).

Boosted gate voltage signal BOOST_H1 (1101) is supplied by a single stage voltage boost circuit 1105, while boosted gate voltage signal BOOST_H2 (1102) is supplied by a double stage voltage boost circuit 1115. Single stage boost circuit 1105 supplies boosted gate voltage signal BOOST_H1 (1101) to the precharge transistors (e.g., 820 of FIG. 12) in all the boost cells. Double stage boost circuit 1115 supplies boosted gate voltage signal BOOST_H2 (1102) to the precharge circuit (e.g., 522 of FIG. 9, and 622 of FIG. 10). Portions of the timing and control of the precharge for the boost cells is thus supplied through these boost circuits.

To switch a boosting cell in or out, a switching circuit may be employed at the output of each boost cell. Since it is desired to have high speed, a high voltage switch is not employed. Since each of the boosting cells are tied together, if some cells are off and other cells are on, then the off cells, along with the wordline path, will act as the load seen by the "on cells." Therefore the size of the various capacitors within the boost cells ($C_{BA}$, $C_{BB}$, $C_{0A}$, $C_{0B}$ . . . $C_{(n-1)A}$, $C_{(n-1)B}$) may, in one example, be sized to take such effect into account. This may be accomplished by solving concurrently five equations and five unknowns (since the present example has 1 pre-boost cell and 4 boost cells coupled to the output), with equation written for a different $V_{DD}$ voltage values (e.g., 1.6V, 1.7V, 1.8V, 1.9V and 2.0V. For each equation, the charge on the capacitors before and after the charge is transferred to the capacitive loading is equated. Since 2 capacitors are coupled in series within each boost cell, their equivalent capacitance is C/2. The five equations may be formulated as follows:

$$V_{BOOST}(C_3/2+C_2/2+C_1/2+C_0/2+C_{LOAD})+(V_{BOOST}-2)(C_4/2)=2(C_4+C_3+C_2+C_1+C_0+C_{LOAD}) \quad (1)$$

$$V_{BOOST}(C_2/2+C_1/2+C_0/2+C_{LOAD})+(V_{BOOST}-1.9)(C_4/2+C_3/2)= 1.9(C_4+C_3+C_2+C_1+C_0+C_{LOAD}) \quad (2)$$

$$V_{BOOST}(C_2/2+C_1/2+C_0/2+C_{LOAD})+(V_{BOOST}-1.8)(C_4/2+C_3/2+C_2/2)=1.8(C_4+C_3+C_2+C_1+C_0+C_{LOAD}) \quad (3)$$

$$V_{BOOST})C_0/2+C_{LOAD})+(V_{BOOST}-1.7)(C_4/2+C_3+C_2/2+C_1/2)= 1.7(C_4+C_3+C_2+C_1+C_0+C_{LOAD}) \quad (4)$$

$$V_{BOOST}(C_{LOAD})+(V_{BOOST}-1.6)(C_4/2+C_3/2+C_2/2+C_1/2+C_0/2)= 1.6(C_4+C_3+C_2+C_1+C_0+C_{LOAD}) \quad (5)$$

Figure 16:
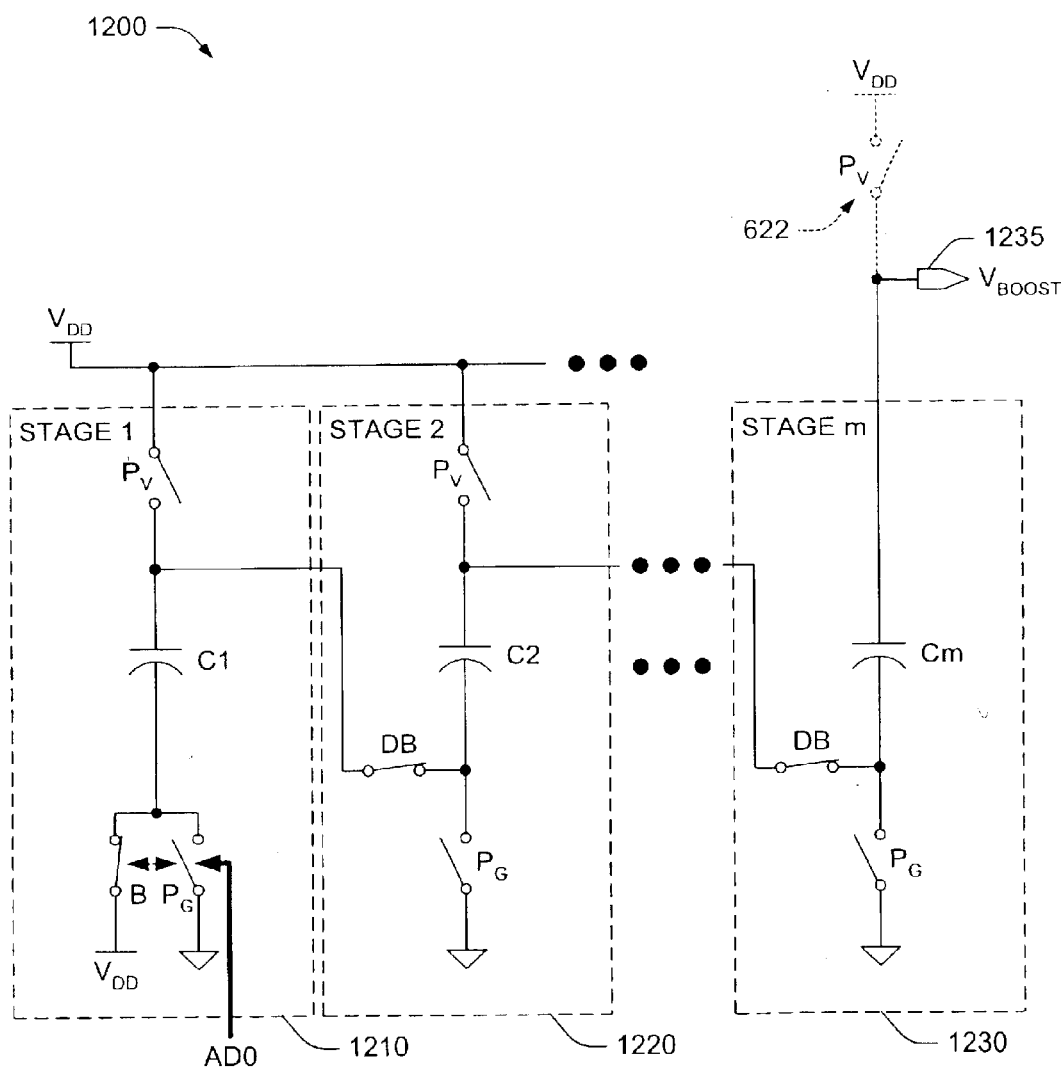
FIG. 16 is a schematic illustration of a multi-stage voltage boost cell of an exemplary regulated voltage booster using digital supply voltage compensation in accordance with an aspect of the invention.

FIG. 16 illustrates an equivalent circuit of an exemplary multi-stage voltage boost cell 1200 of an exemplary regulated voltage booster (e.g., 600 of FIG. 10) using digital supply voltage compensation in accordance with another aspect of the invention. The multi-stage voltage boost cell 1200 is an extension of the two stage voltage booster 450 of FIG. 8, and as such functions and operates similarly and need not be fully described again for the sake of brevity. Multi-stage voltage boost cell 1200 comprises stages (1, 2 . . . m) 1210, 1220, and 1230 respectively, for boosting the $V_{BOOST}$ word line 1235 up to a potential $(m+1)V_{DD}$ voltage value. Each boost stage comprises a boost capacitor $C_{1-m}$, a pull-up precharge switch $P_V$ (e.g., a transistor) coupleable to $V_{DD}$), a grounding precharge switch $P_G$ (e.g., a transistor) coupleable to a ground potential. Additionally, each multi-stage voltage boost cell 1200, has a boost switch B coupleable to a boost potential (e.g., $V_{DD}$) for the preboost and boost time intervals to apply $V_{DD}$ to the $C_1$ (bottom) boost capacitor of the series of capacitors.

Further, all but stage 1 (1210) would have a coupling switch DB for series coupling all the boost capacitors $C_{1-m}$, while stage 1 of each of the boost cells, except for the default fixed boost cell, would have a single bit input AD(0-(n-1)) of a digital word (e.g., 625 of FIG. 10) from, for example, an A/D converter. Particular to stage mn, the pull-up precharge switch $P_V$ (e.g., 622 of FIG. 10 and external to the boost cell) is coupled to the common node of the $V_{BOOST}$ word line 1235 which is common to all the boost cells, and also coupleable to $V_{DD}$.

Figure 17:
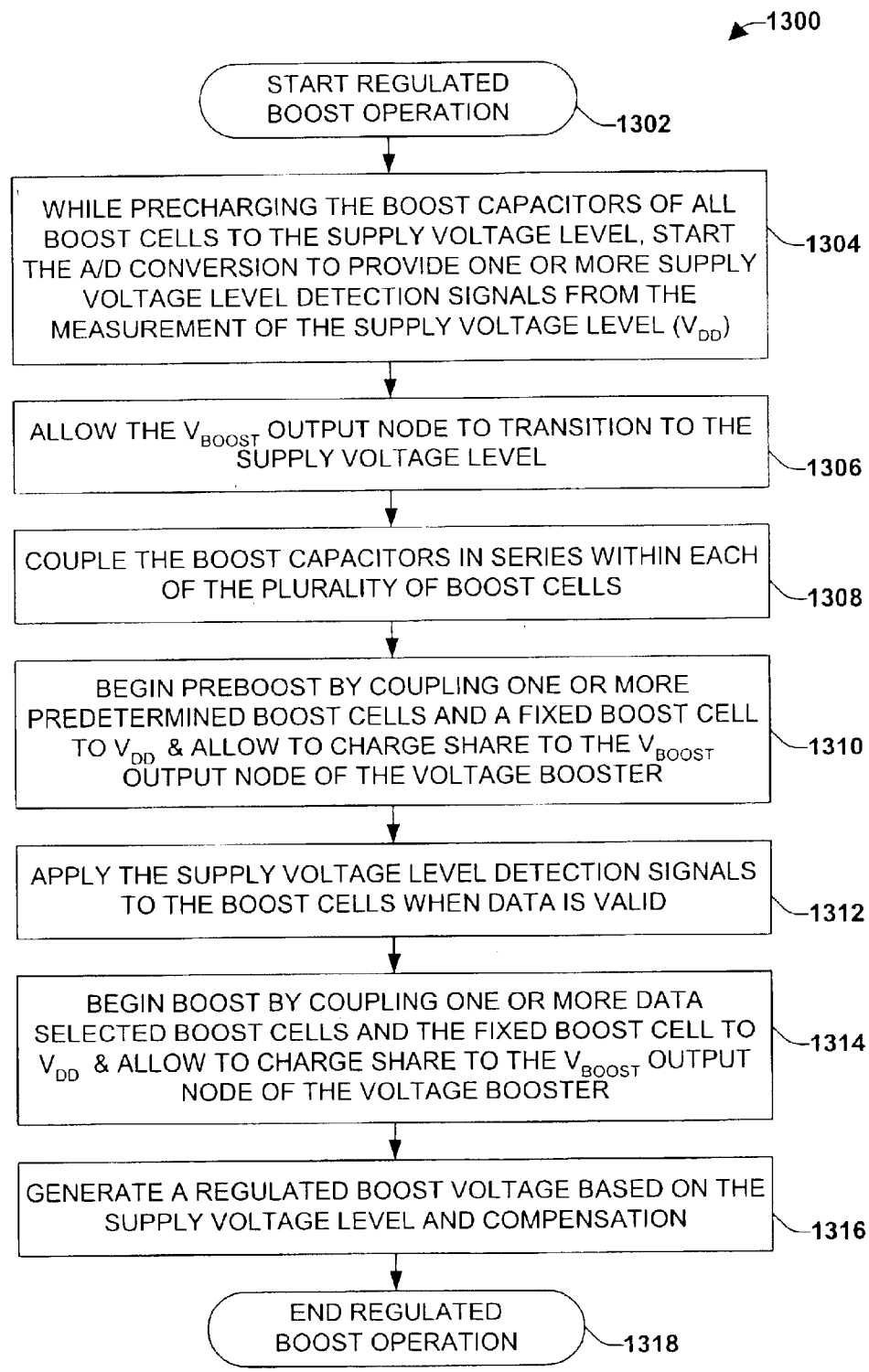
FIG. 17 is a flow diagram illustrating an exemplary method for a regulated booster operation in association with an aspect of the present invention.

Another aspect of the invention provides a methodology for regulating the boost operation in a memory device, which may be employed in association with the memory devices illustrated and described herein, as well as with other memory devices. Referring now to FIG. 17, an exemplary method 1300 is illustrated for regulating the boost operation in a memory device. While the exemplary method 1300 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 1300 may be implemented in association with the apparatus and systems illustrated and described herein as well as in association with other systems not illustrated.

The method 1300 comprises precharging a plurality of boost cells of a multi-stage voltage booster circuit while starting a supply voltage level detection (e.g., an A/D converter, digital thermometer), in order to control one or more boost cells used in a boost voltage compensation circuit corresponding to the supply error, and to correct for the supply level error reflected in the output of a voltage boost circuit. The regulated boost operation method begins at step 1302. At 1304 the boost capacitors within each boost cell are initially precharged to the supply voltage (e.g., $V_{DD}$) while the supply level detection circuit is enabled to begin sampling and measuring the supply voltage level. At 1306, the $V_{BOOST}$ output node (e.g., 632 of FIG. 10) of the voltage booster circuit is allowed to transition to the supply voltage level. At 1308, the boost capacitors within each of the boost cells are coupled in series (e.g., by switch DB 468 of FIG. 8, or 868 of FIG. 12). At 1310, a preboost of the $V_{BOOST}$ output node begins by coupling one or more of a set of predetermined (e.g., by a prewired logic circuit 910 of FIG. 13) boost cells (e.g., 900 of FIG. 13) along with a fixed boost cell (e.g., 1000 of FIG. 14) to the supply voltage, and allowing the capacitors of the boost cells to charge share to the $V_{BOOST}$ output node of the voltage booster circuit. This pre-boost occurs while the supply voltage value is still in the process of being ascertained.

When the data is made available, for example, by the A/D latch signal AD_LT (e.g. 346 of FIG. 6, 626 of FIG. 10), the supply voltage level detection circuit generates one or more supply voltage level detection signals (e.g., 345 associated in FIG. 6 with A/D 342, or 625 in FIG. 10), in response to the $\Delta V_{DD}$ compared to a target value set by a reference voltage, in order to apply the supply voltage level detection signals to a boost compensation circuit at 1312, wherein the boosted voltage is greater than the supply voltage.

At 1314, the supply level detection signals are used to select one or more boost cells which are coupled along with the fixed boost cell to the supply voltage and allowed to charge share with each other and the supply voltage applied to the boost cells, and with the $V_{BOOST}$ output node of the voltage booster circuit. Further, during this boost period, some cells may be deselected to provide compensation (adjustment). Thereafter, a regulated boost voltage $V_{BOOST}$ resulting from the applied compensation is produced at step 1316 in order to ascertain the data value stored in a memory cell. The regulated boost operation thereafter ends at 1318, and the method 1300 may be repeated for subsequent voltage boost and read operations of the memory device. The methodology 1300 thus provides for quick, accurate voltage boosting in a voltage boost circuit that uses an A/D converter to compensate for $V_{DD}$ voltage variations, which may be applied to a word line of memory core cells during read operations of flash memory arrays. Therefore the method 1300 generates a $V_{BOOST}$ voltage that is substantially independent of variations in $V_{DD}$. Other variants of methodologies may be provided in accordance with the present invention, whereby compensation or regulation of a boosted voltage is accomplished.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A system for generating a regulated boosted voltage, comprising:

a multi-stage voltage boost circuit operable to receive a supply voltage and one or more output signals from a supply voltage detection circuit to generate the boosted word line voltage having a value greater than the supply voltage, the voltage boost circuit comprising:

a precharge circuit;

a plurality of boost cells each having a plurality of boost stages and a stage precharge switch, the boost cells and the precharge circuit connected to a common node;

a timing control circuit operable to initiate and control the precharge circuit and the stage precharge switch to initially charge the stages of the plurality of boost cells to the supply voltage during a precharge timing, to initiate and control voltage boosting of the boost cells during a pre-boost timing and a boost timing, wherein the stages of the plurality of boost cells are coupled in series for charge sharing between the stages, and to couple a predetermined number of boost cells to the common node to provide an intermediate voltage to the common node during the pre-boost timing, thereby anticipating a final boosted voltage at the common node, which is provided during the boost timing; and wherein the voltage boost circuit is operable to receive the one or more output signals from the supply voltage detection circuit and alter the boost gain of the multi-stage voltage boost circuit during the boost timing based on the one or more output signals, thereby causing the boosted voltage at the common node to be substantially independent of the supply voltage value.

2. The system of claim 1, wherein the altering of the boost gain of the voltage boost circuit alters an effective boost capacitance and an effective load capacitance, thereby resulting in a boosted voltage that is substantially independent of variations in the supply voltage.

3. The system of claim 1, wherein the timing control circuit comprises:

a precharge gate booster operable to provide a boosted gate signal to the precharge circuit and the stage precharge switch to initiate charging the stages of the plurality of boost cells to the supply voltage during a precharge timing;

a boost timer operable to initiate and control voltage boosting of the boost cells during a pre-boost timing and a boost timing, wherein the stages of the plurality of boost cells are coupled in series for charge sharing between the stages; and wherein the timing control circuit is further operable to couple a predetermined number of boost cells to the boosted common node to provide an intermediate voltage to the boosted common node during the pre-boost timing, thereby anticipating the final boosted common node voltage value during the boost timing.

4. The system of claim 1, wherein the precharge circuit comprises a switch operable to couple the supply voltage to the plurality of boost cells to initially charge the stages of the plurality of boost cells to the supply voltage during a precharge timing as directed by the precharge gate booster.

5. The system of claim 1, wherein one or more boost cells of the plurality of boost cells comprises:

a plurality of boost stages having a stage capacitor, wherein each stage is operable to contribute a voltage to the boosted word line output voltage by a value associated with the applied supply voltage;

a stage precharge switch operable to couple the supply voltage to the plurality of boost stages of the boost cell to initially charge the stages to the supply voltage during a precharge timing as directed by the precharge gate booster; and a coupling switch operable to series couple the plurality of stages of the boost cell for charge sharing between the stage capacitors, wherein the boost cell is operable to receive the precharge from the precharge circuit at the common node during the precharge timing.

6. The system of claim 5, wherein one or more boost cells of the plurality of boost cells further comprises:

a logic circuit operable to determine whether the boost cell is configured to provide an intermediate voltage to the boosted common node during the pre-boost timing based on an input from the boost timer, and operable to receive one of the output signals from the supply voltage detection circuit to determine whether the boost cell has been selected to contribute voltage boosting during the boost timing, or whether the stage capacitor is to act as a load capacitor, and further operable to provide an intermediate voltage to the boosted common node during the pre-boost timing, thereby anticipating a final boosted common node voltage which is provided during the boost timing in response to the output signal from the supply voltage detection circuit.

7. The system of claim 5, wherein the boost cells further comprise a precharge circuit to initially charge the stages of the plurality of boost cells to the supply voltage during a precharge timing as directed by the precharge gate booster.

8. The system of claim 1, wherein each boost cell of the plurality of boost cells comprises:

a first stage capacitor having a first terminal selectively coupled to the supply voltage through a first stage precharge switch and a second terminal coupled to a boost signal;

a second stage capacitor having a first terminal coupled to the boosted common node which forms an output of the voltage boost cell, and a second terminal selectively coupled through a second stage precharge switch to a circuit ground potential;

a coupling switch to provide series coupling between the first and second stage capacitors, the coupling switch having a first terminal coupled to the first terminal of the first stage capacitor, a second terminal coupled to the second terminal of the second stage capacitor, and a third terminal coupled to a boost timing input terminal from the boost timer;

the first stage precharge switch having a first terminal coupled to the supply voltage, a second terminal coupled to the first terminal of the first stage capacitor and the first terminal of the coupling switch, and a third terminal coupled to a first stage recharge timing input terminal from the precharge gate booster;

the second stage precharge switch having a first terminal coupled to the second terminal of the second stage capacitor and the second terminal of the coupling switch, a second terminal coupled the circuit ground potential, and a third terminal coupled to a second stage boost timing input terminal from the boost timer;

a logic circuit operable to determine whether the boost cell was predetermined to provide an intermediate voltage to the boosted common node during the pre-boost timing based on an input signal from the boost timer, and operable to receive one of the output signals from the supply voltage detection circuit to determine whether the boost cell has been selected to contribute voltage boosting during the boost timing, or whether the stage capacitor is to act as a load capacitor in a nonselected boost cell; and wherein when the input signal from the boost timer is low and the boost capacitors of the boost cell and the load capacitors of the nonselected boost cells charge to a voltage value which is greater than the supply voltage value, and when the switch is open, the boost signal is at a high level equal to about the supply voltage, and the boost capacitors and the load capacitors experience charge sharing, thereby causing the first terminals thereof to increase to a boost voltage value greater than the supply voltage value, wherein the boost voltage value is a function of the capacitance of the boost capacitor and the load capacitor, respectively.

9. The system of claim 8, wherein the voltage boost circuit comprises:
   a plurality of boost cells each having a first terminal coupled to the first terminals of the stage capacitors, and each having a second terminal which is selectively coupleable to a circuit ground potential or a voltage potential approximately equal to the supply voltage based on the one or more output signals from the supply voltage detection circuit, thereby causing one or more of the plurality of stage capacitors to contribute three times the supply voltage along with the default boost cell when the boost cells are selected, or two times the supply voltage to the boosted word line when the boost cells are not selected by the output signals from the supply voltage detection circuit, thereby adjusting the boost gain based on the supply voltage value.

10. The system of claim 1, wherein the one or more output signals from the supply voltage detection circuit comprises:
    a plurality of voltages associated with the supply voltage, and which collectively form a digital word which reflects the supply voltage value.

11. The system of claim 1, wherein the bits of the digital word have a binary weighting across a range of voltage detection, along with a corresponding binary weighting of their respective boost cell stage capacitors used for boost compensation.

12. A method of generating a boost voltage that is substantially independent of variations in a supply voltage, comprising:
    varying a boost gain of a voltage boost circuit used to generate the boost voltage in response to a detected supply voltage value, wherein the boost gain variation causes the boost voltage to be substantially independent of variations in the supply voltage,
    wherein varying the boost gain occurs in two phases, wherein in a pre-boost phase the gain is varied a predetermined amount while the supply voltage is being detected, and wherein in a boost phase that follows the pre-boost phase the gain is varied a further amount based on the detected supply voltage value.

13. The method of claim 12, wherein detecting the supply voltage value comprises:
    inputting the supply voltage value into an analog-to-digital converter; and
    generating a multi-bit digital word which is related to the supply voltage value.

14. The method of claim 12, wherein detecting the supply voltage value comprises:
    generating a plurality of voltage values associated with the supply voltage value;
    comparing each of the plurality of voltage values to a reference voltage value; and
    generating a digital output value associated with each of the comparisons, thereby generating a multi-bit digital word and reflecting the supply voltage value.

15. The method of claim 12, wherein the varying of the boost gain of the voltage boost circuit comprises altering an effective boost capacitance and an effective load capacitance, thereby resulting in a boosted word line voltage which is substantially independent of variations in the supply voltage.

16. The method of claim 15, wherein the voltage boost circuit comprises a plurality of boost cells, each cell having a plurality of boost capacitors, the boost cells having a first terminal coupled to an output node of the voltage boost circuit and a precharge circuit, a second terminal coupled to a boost signal, and a third terminal coupled to one or more output signals from the detected supply voltage value, and wherein the voltage boost circuit further comprises a load capacitor having a first terminal coupled to a circuit ground potential and a second terminal coupled to the output node, wherein varying the boost gain comprises:
    while precharging the boost capacitors of the boost cells by coupling a first terminal of a plurality of boost capacitors to the supply voltage, and a second terminal of the plurality of boost capacitors to a ground potential, enable the supply level detection to provide the one or more output signals from the detected supply voltage value to an input terminal of the voltage booster circuit;
    allowing the output node of the voltage boost circuit to transition to a level approximately equal to the supply voltage level;
    coupling the plurality of boost capacitors in series within each boost cell;
    coupling the second terminal of the one or more predetermined boost cells and a fixed boost cell to the supply voltage level and allowing the series capacitors to charge share to preboost the output node of the voltage boost circuit;
    applying the supply voltage level detection signals to the boost cells when the supply voltage level detection signal data is valid;
    coupling the second terminal of one or more selected boost cells of the plurality of boost cells and the fixed boost cell to the supply voltage level; and
    allowing the boost capacitors to charge share with the supply voltage to boost the output node of the voltage boost circuit to a final boost voltage based on the one or more output signals from the detected supply voltage value, thereby altering an effective boost capacitance and an effective load capacitance associated with the boost capacitor and the load capacitor based on the detected supply voltage value.

17. The method of claim 12, wherein one or more predetermined boost cells are temporarily forced to the ON state during the pre-boost timing interval to anticipate a final boost voltage.

18. The method of claim 12, wherein all the boost cells are temporarily forced to the ON state during the pre-boost timing interval to anticipate a final boost voltage.

19. A system for generating a regulated boost voltage, comprising:
    a multi-stage voltage boost circuit operable to receive a supply voltage and one or more output signals from a supply voltage detection circuit and to generate a boosted voltage having a value greater than the supply voltage; and
    a voltage boost compensation circuit operably coupled to the supply voltage detection circuit and the voltage boost circuit, and operable to receive the one or more output signals from the supply voltage detection circuit and alter a boost gain of the multi-stage voltage boost circuit based on the one or more output signals, thereby causing the boosted voltage to be substantially independent of the supply voltage value,
    wherein the boost gain is altered in two phases, wherein in a pre-boost phase the gain is altered a predetermined amount while the supply voltage is being detected, and in a boost phase that follows the pre-boost phase the gain is altered a further amount based on the detected supply voltage value.

* * * * *